United States Patent
Han et al.

(10) Patent No.: US 11,695,422 B2
(45) Date of Patent: Jul. 4, 2023

(54) DELAY LINE, A DELAY LOCKED LOOP CIRCUIT AND A SEMICONDUCTOR APPARATUS USING THE DELAY LINE AND THE DELAY LOCKED LOOP CIRCUIT

(71) Applicant: SK hynix Inc., Icheon-si (KR)

(72) Inventors: Yun Tack Han, Icheon-si (KR); Kyeong Min Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/514,751

(22) Filed: Oct. 29, 2021

(65) Prior Publication Data

US 2022/0052700 A1 Feb. 17, 2022

Related U.S. Application Data

(62) Division of application No. 16/911,888, filed on Jun. 25, 2020, now Pat. No. 11,206,026.

(30) Foreign Application Priority Data

Sep. 6, 2019 (KR) .................. 10-2019-0110563
Sep. 6, 2019 (KR) .................. 10-2019-0110569

(51) Int. Cl.
| | |
|---|---|
| *H03L 7/089* | (2006.01) |
| *H03L 7/087* | (2006.01) |
| *H03L 7/081* | (2006.01) |
| *H03L 7/07* | (2006.01) |

(52) U.S. Cl.
CPC .............. *H03L 7/0896* (2013.01); *H03L 7/07* (2013.01); *H03L 7/087* (2013.01); *H03L 7/0814* (2013.01)

(58) Field of Classification Search
CPC ..... H03L 7/0896; H03L 7/0814; H03L 7/087; H03L 7/07; H03L 7/0816; H03L 7/0818
See application file for complete search history.

(56) References Cited

U.S. PATENT DOCUMENTS

| | | | |
|---|---|---|---|
| 5,304,867 | A | 4/1994 | Morris |
| 6,094,103 | A | 7/2000 | Jeong et al. |
| 6,097,216 | A | 8/2000 | Youn |
| 6,198,322 | B1 | 3/2001 | Yoshimura |

(Continued)

FOREIGN PATENT DOCUMENTS

| | | |
|---|---|---|
| KR | 100970808 B1 | 7/2010 |
| KR | 101606187 B1 | 3/2016 |
| KR | 1020180046429 A | 5/2018 |

OTHER PUBLICATIONS

Kuo-Sing Cheng et al., A Wide-Range DLL-based Clock Generator with Phase Error Calibration, 2008 15th IEEE International Conference on Electronics, Circuits and Systems, Aug. 31-Sep. 3, 2008, pp. 798-801, St. Julien's, Malta.

(Continued)

*Primary Examiner* — Patrick C Chen
(74) *Attorney, Agent, or Firm* — William Park & Associates Ltd.

(57) ABSTRACT

A delay locked loop circuit includes a first delay locked loop and a second delay locked loop having different characteristics. The first delay locked loop performs a delay-locking operation on a reference clock signal to generate a delay locked clock signal. The second delay locked loop performs a delay-locking operation on the delay locked clock signal to generate an internal clock signal.

13 Claims, 15 Drawing Sheets

(56) References Cited

U.S. PATENT DOCUMENTS

| | | |
|---|---|---|
| 6,867,627 B1 | 3/2005 | Murtagh |
| 7,323,918 B1 | 1/2008 | Tai |
| 7,486,119 B2 | 2/2009 | Lee |
| 8,081,038 B2 | 12/2011 | Lee et al. |
| 8,237,478 B2 | 8/2012 | Yun et al. |
| 8,392,744 B2 | 3/2013 | Lin |
| 8,599,984 B2 | 12/2013 | Vlasenko et al. |
| 9,071,232 B2 | 6/2015 | Kim et al. |
| 9,148,135 B2 | 9/2015 | Li et al. |
| 9,741,405 B2 | 8/2017 | Suetinov et al. |
| 2006/0023562 A1 | 2/2006 | Kim et al. |
| 2008/0036514 A1 | 2/2008 | Tai |
| 2008/0111633 A1 | 5/2008 | Cranford et al. |
| 2008/0122502 A1 | 5/2008 | Kim |
| 2008/0157837 A1 | 7/2008 | Na |
| 2008/0164920 A1 | 7/2008 | Cho |
| 2009/0066379 A1* | 3/2009 | Kim ............... H03L 7/0812 327/158 |
| 2009/0240970 A1* | 9/2009 | Lin ............... G06F 1/10 327/296 |
| 2011/0128056 A1 | 6/2011 | An |
| 2012/0137161 A1 | 5/2012 | Harrison |
| 2013/0038369 A1 | 2/2013 | Lee et al. |
| 2015/0130520 A1* | 5/2015 | Matsuda ............... H03L 7/0812 327/156 |
| 2016/0043860 A1 | 2/2016 | Tu et al. |

OTHER PUBLICATIONS

Po-Chun Huang et al., A Phase Error Calibration DLL with Edge Combiner for Wide-Range Operation, 2011 IEEE 9th International New Circuits and systems conference, Jun. 26-29, 2011, pp. 1-4, Bordeaux, France.

Shao-Ku Kao, A delay-locked loop with self-calibration circuit for reducing phase error, Microelectronics Journal 44, Apr. 22, 2013, pp. 663-669, Elsevier Ltd.

Wei-Hao Chiu et al., A Dynamic Phase Error Compensation Technique for Fast-Locking Phase-Locked Loops, IEEE Journal of Solid-State Circuits, Jun. 2010, pp. 1137-1149, vol. 45, No. 6.

* cited by examiner

DELAY LINE, A DELAY LOCKED LOOP CIRCUIT AND A SEMICONDUCTOR APPARATUS USING THE DELAY LINE AND THE DELAY LOCKED LOOP CIRCUIT

CROSS-REFERENCES TO RELATED APPLICATION

The present application is a divisional application of U.S. patent application Ser. No. 16/911,888, filed on Jun. 25, 2020, and claims priority under 35 U.S.C. § 119(a) to Korean application numbers 10-2019-0110563 and 10-2019-0110569, filed on Sep. 6, 2019, in the Korean Intellectual Property Office, which is incorporated herein by reference in its entirety as set forth in full.

BACKGROUND

1. Technical Field

Various embodiments generally relate to an integrated circuit technology, and more particularly, to a delay line, a delay locked loop circuit and a semiconductor apparatus using the delay line and delay locked loop.

2. Related Art

An electronic device includes a lot of electronic elements and, a computer system may include a lot of semiconductor apparatuses each configured by a semiconductor. Semiconductor apparatuses configuring a computer system may communicate with one another by transmitting and receiving a clock signal and data. The semiconductor apparatus may operate in synchronization with a clock signal. The semiconductor apparatus may transmit and/or receive a system clock signal to and/or from an external apparatus (i.e., another semiconductor apparatus) and may transmit and/or receive data to and/or from the external apparatus in synchronization with the system clock signal. The semiconductor apparatus may include a clock buffer and/or a receiver to receive the system clock signal and may transfer the received system clock signal to an internal circuit related to data input/output operation and an internal circuit operative in synchronization with a clock signal. Therefore, there may occur phase difference between the system clock signal and the clock signal, which the internal circuits receive, due to delay time occurring within the semiconductor apparatus. Therefore, the semiconductor apparatus includes a delay locked loop circuit to compensate for the above-described phase difference. In general, examples of the delay locked loop circuit are a digital delay locked loop utilizing a digitally controlled delay line and an analog delay locked loop utilizing a voltage-controlled delay line.

SUMMARY

In accordance with an embodiment, a delay locked loop circuit may include a first delay locked loop and a second delay locked loop. The first delay locked loop may perform a delay-locking operation on the reference clock signal based on a reference clock signal and an internal clock signal to generate a delay locked clock signal. The second delay locked loop may perform a delay-locking operation on the delay locked clock signal based on the delay locked clock signal and the internal clock signal to generate the internal clock signal.

In accordance with an embodiment, a semiconductor apparatus may include a clock receiver, a division circuit, a first delay locked loop, a second delay locked loop and a clock generation circuit. The clock receiver may buffer an external clock signal to output a buffered clock signal. The division circuit may divide the buffered clock signal to generate a reference clock signal and selectively output the buffered clock signal based on a frequency information signal. The first delay locked loop may perform a delay-locking operation based on the reference clock signal and one signal selected on the basis of the frequency information signal between a first output clock signal and a second output clock signal to generate a first delay locked clock signal from the reference clock signal and a second delay locked clock signal from the buffered clock signal. The second delay locked loop may perform a delay-locking operation on the first delay locked clock signal based on the first delay locked clock signal and the first output clock signal to generate the first output clock signal. The clock generation circuit may generate the second output clock signal based on the second delay locked clock signal.

In accordance with an embodiment, a delay locked loop circuit may include a voltage-controlled delay line, a calibration circuit, a phase detector and a charge pump. The voltage-controlled delay line may delay a reference clock signal based on a delay control voltage to generate an internal clock signal and a feedback clock signal. The calibration circuit may delay the internal clock signal and the feedback clock signal based on the internal clock signal and the feedback clock signal to generate a delayed reference clock signal and a delayed feedback clock signal. The phase detector configured to compare phases between the delayed reference clock signal and the delayed feedback clock signal to generate a phase detection signal. The charge pump may generate the delay control voltage based on the phase detection signal.

DETAILED DESCRIPTION

Figure 1:
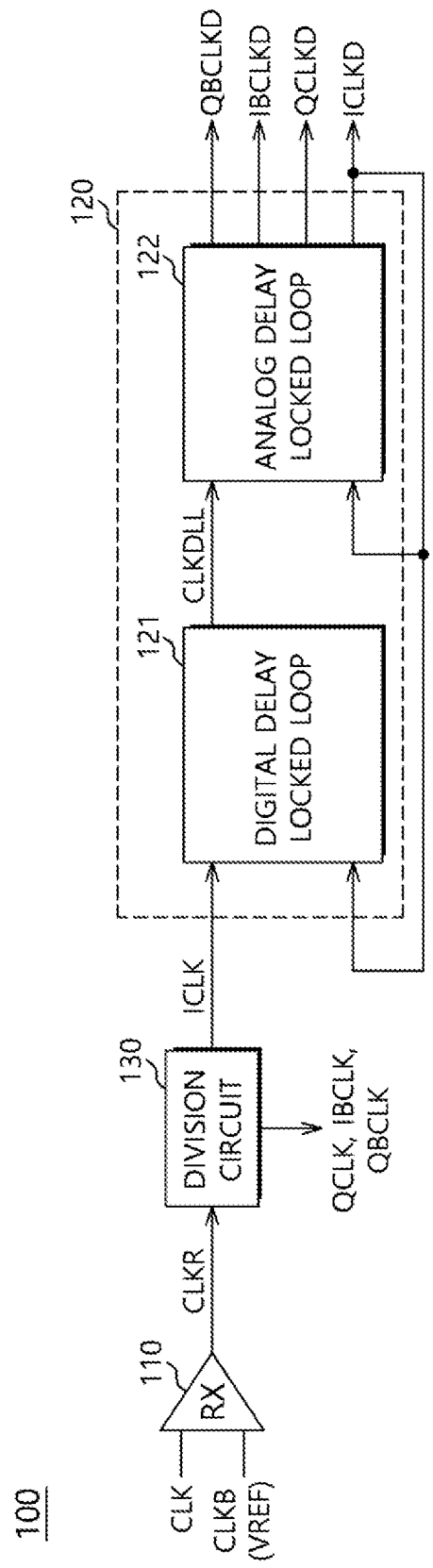
FIG. 1 is a diagram illustrating a configuration of a semiconductor apparatus in accordance with an embodiment.

FIG. 1 is a diagram illustrating a configuration of a semiconductor apparatus 100 in accordance with an embodiment. Referring to FIG. 1, the semiconductor apparatus 100 may receive a clock signal CLK to generate a plurality of internal clock signals. The clock signal CLK may be an external clock signal provided from an external apparatus coupled to the semiconductor apparatus 100. In an embodiment, the clock signal CLK may be a periodic signal generated from a clock generator such as an oscillator. The semiconductor apparatus 100 may perform a delay-locking operation on the clock signal CLK to generate the plurality of internal clock signals. The semiconductor apparatus 100 may include a delay locked loop circuit including at least two delay locked loops, which have different characteristics from each other. The delay locked loop circuit may perform the delay-locking operation on the clock signal CLK through at least one between the two delay locked loops. The two delay locked loops may include a digital delay locked loop and an analog delay locked loop.

The semiconductor apparatus 100 may include a clock receiver 110 and a delay locked loop circuit 120. The clock receiver 110 may receive the clock signal CLK. The clock receiver 110 may receive the clock signal CLK to output a buffered clock signal CLKR. The clock signal CLK may be transmitted, together with a complementary signal CLKB, as a differential signal. The clock signal CLK may be transmitted as a single-ended signal. When the clock signal CLK is transmitted as a differential signal, the clock receiver 110 may differentially amplify the clock signal CLK and the complementary signal CLKB to output the buffered clock signal CLKR. When the clock signal CLK is transmitted as a single-ended signal, the clock receiver 110 may differentially amplify the clock signal CLK and a reference voltage VREF to output the buffered clock signal CLKR. The reference voltage VREF may have a voltage level corresponding to a middle of the amplitude of the clock signal CLK.

The delay locked loop circuit 120 may receive a reference clock signal and may perform a delay-locking operation on the reference clock signal. The buffered clock signal CLKR generated from the clock receiver 110 may be provided as the reference clock signal. The semiconductor apparatus 100 may further include division circuit 130. The division circuit 130 may receive the buffered clock signal CLKR and may divide the frequency of the buffered clock signal CLKR to provide the divided clock signal as the reference clock signal. When the semiconductor apparatus 100 operates at a relatively low frequency, the delay locked loop circuit 120 may receive the buffered clock signal CLKR as the reference clock signal to perform a delay-locking operation. When the semiconductor apparatus 100 operates at a relatively high frequency, the delay locked loop circuit 120 may receive the clock signal, which is divided by the division circuit 130, as the reference clock signal to perform a delay-locking operation. The division circuit 130 may divide the buffered clock signal CLKR to generate a first divided clock signal ICLK, a second divided clock signal QCLK, a third divided clock signal IBCLK and a fourth divided clock signal QBCLK.

The first to fourth divided clock signals ICLK, QCLK, IBCLK and QBCLK may have lower frequencies or longer periods than the buffered clock signal CLKR. The first divided clock signal ICLK may have the same phase as the buffered clock signal CLKR and may have a leading phase to the second divided clock signal QCLK by an amount of 90 degrees. The second divided clock signal QCLK may have a leading phase to the third divided clock signal IBCLK by an amount of 90 degrees. The third divided clock signal IBCLK may have a leading phase to the fourth divided clock signal QBCLK by an amount of 90 degrees. The fourth divided clock signal QBCLK may have a leading phase to the first divided clock signal ICLK by an amount of 90 degrees. The delay locked loop circuit 120 may receive the first divided clock signal ICLK as the reference clock signal and may perform a delay-locking operation on the first divided clock signal ICLK. In an embodiment, the delay locked loop circuit 120 may receive the second divided clock signal QCLK as the reference clock signal and may perform a delay-locking operation on the second divided clock signal QCLK.

The delay locked loop circuit 120 may include a first delay locked loop 121 and a second delay locked loop 122. The first delay locked loop 121 may be a digital delay locked loop. The second delay locked loop 122 may be an analog delay locked loop. The first delay locked loop 121 may receive the reference clock signal and an internal reference clock signal. The first delay locked loop 121 may perform a delay-locking operation on the reference clock signal based on the reference clock signal and the internal reference clock signal to generate a delay locked clock signal CLKDLL. The second delay locked loop 122 may receive the delay locked clock signal CLKDLL and the internal reference clock signal. The second delay locked loop 122 may receive the delay locked clock signal CLKDLL and the internal reference clock signal and may perform a delay-locking operation on the delay locked clock signal CLKDLL to generate the internal reference clock signal.

For compensation for modelled delay time, the first delay locked loop 121 may delay the reference clock signal to generate the delay locked clock signal CLKDLL. The second delay locked loop 122 may adjust the phase of the delay locked clock signal CLKDLL and may generate, from the delay locked clock signal CLKDLL, a plurality of internal clock signals having different phases from one another. The plurality of internal clock signals may include a first internal clock signal ICLKD, a second internal clock signal QCLKD, a third internal clock signal IBCLKD and a fourth internal clock signal QBCLKD. The first internal clock signal ICLKD may be provided as the internal reference clock signal. The first internal clock signal ICLKD may have a leading phase to the second internal clock signal QCLKD by an amount of 90 degrees. The second internal clock signal QCLKD may have a leading phase to the third internal clock signal IBCLKD by an amount of 90 degrees. The third internal clock signal IBCLKD may have a leading phase to the fourth internal clock signal QBCLKD by an amount of 90 degrees. The fourth internal clock signal QBCLKD may have a leading phase to the first internal clock signal ICLKD by an amount of 90 degrees. The first to fourth internal clock signals ICLKD, QCLKD, IBCLKD and QBCLKD may be provided to internal circuits, which operate in synchronization with a clock signal among various internal circuits included in the semiconductor apparatus 100. Hereinafter, the terms "internal reference clock signal" and "internal clock signal" may indicate the same clock signal unless explicitly stated otherwise.

In general, a digital delay locked loop may be capable of performing a fast delay-locking operation and may perform a delay-locking operation on a clock signal having a broader frequency band than an analog delay locked loop. However, it may be difficult for a delay locked loop with one delay line to perform a delay-locking operation on a clock signal having a particular frequency or higher. A dual delay locked loop is designed to have two delay lines in order to settle the difficulty. However, there may easily occur a skew on phases of a plurality of internal clock signals generated from the dual delay locked loop due to process variation between the two delay lines. Therefore, in accordance with an embodiment, the semiconductor apparatus 100 adopts the delay locked loop circuit 120 having both of a digital delay locked loop and an analog delay locked loop, which makes it possible to perform a delay-locking operation on a clock signal having a high frequency and to generate a plurality of internal clock signals having precise phase difference.

Figure 2:
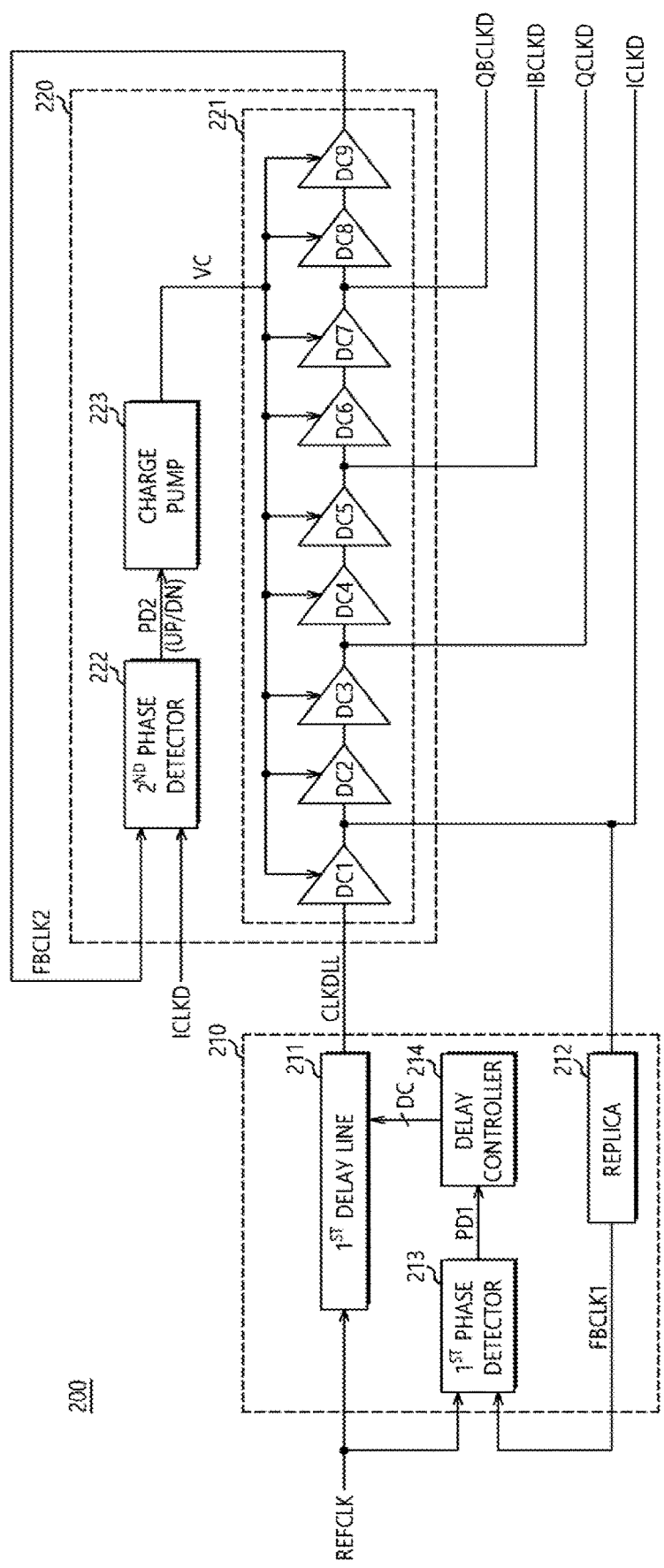
FIG. 2 is a diagram illustrating a configuration of a delay locked loop circuit in accordance with an embodiment.

FIG. 2 is a diagram illustrating a configuration of a delay locked loop circuit 200 in accordance with an embodiment. The delay locked loop circuit 200 may be applied as the delay locked loop circuit 120 illustrated in FIG. 1. Referring to FIG. 2, the delay locked loop circuit 200 may include a first delay locked loop 210 and a second delay locked loop 220. The first delay locked loop 210 may be a digital delay locked loop. The second delay locked loop 220 may be an analog delay locked loop. The first delay locked loop 210 may receive a reference clock signal REFCLK and an internal clock signal ICLKD. The first delay locked loop 210 may perform a delay-locking operation on the reference clock signal REFCLK based on the reference clock signal REFCLK and the internal clock signal ICLKD to generate a delay locked clock signal CLKDLL. The second delay locked loop 220 may receive the delay locked clock signal CLKDLL. The second delay locked loop 220 may perform a delay-locking operation on the delay locked clock signal CLKDLL to generate first to fourth internal clock signals ICLKD, QCLKD, IBCLKD and QBCLKD. Any one among the first to fourth internal clock signals ICLKD, QCLKD, IBCLKD and QBCLKD may be provided as the internal reference clock signal. For example, the first internal clock signal ICLKD may be utilized as the internal reference clock signal.

The first delay locked loop 210 may include a first delay line 211, a replica 212, a first phase detector 213 and a delay controller 214. The first delay line 211 may receive the reference clock signal REFCLK and a delay control signal DC. The first delay line 211 may delay the reference clock signal REFCLK based on the delay control signal DC to generate the delay locked clock signal CLKDLL. The first delay line 211 may be a digitally controlled delay line. A delay amount of the first delay line 211 may be set on the basis of the delay control signal DC. The first delay line 211 may delay the reference clock signal REFCLK by the delay amount, which is set by the delay control signal DC, to generate the delay locked clock signal CLKDLL.

The replica 212 may receive the internal clock signal ICLKD as the internal reference clock signal. The replica 212 may delay the internal clock signal ICLKD to generate a first feedback clock signal FBCLK1. The replica 212 may be designed by modelling a transmission path, through which the clock signal CLK is transferred within the semiconductor apparatus 100 illustrated in FIG. 1. Therefore, the replica 212 may have a delay amount corresponding to delay time occurring due to the transmission path, through which the clock signal CLK is transferred. The replica 212 may delay the internal reference clock signal by an amount of the modelled delay time to generate the first feedback clock signal FBCLK1.

The first phase detector 213 may receive the reference clock signal REFCLK and the first feedback clock signal FBCLK1. The first phase detector 213 may compare phases between the reference clock signal REFCLK and the first feedback clock signal FBCLK1 to generate a first phase detection signal PD1. The first phase detector 213 may change the logic level of the first phase detection signal PD1 depending on whether the reference clock signal REFCLK has a leading phase or a lagging phase to the first feedback clock signal FBCLK1. For example, the first phase detector 213 may generate, when the reference clock signal REFCLK has a leading phase to the first feedback clock signal FBCLK1, the first phase detection signal PD1 having a logic high level. For example, the first phase detector 213 may generate, when the reference clock signal REFCLK has a lagging phase to the first feedback clock signal FBCLK1, the first phase detection signal PD1 having a logic low level.

The delay controller 214 may receive the first phase detection signal PD1 to generate the delay control signal DC. The delay control signal DC may be a digital code signal having a plurality of bits. The delay controller 214 may change a code value of the delay control signal DC based on the first phase detection signal PD1. A delay amount of the first delay line 211 may increase or decrease depending on the code value of the delay control signal DC. The first delay locked loop 210 may perform a delay-locking operation by changing the code value of the delay control signal DC until the reference clock signal REFCLK and the first feedback clock signal FBCLK1 have the same phase. The first delay locked loop 210 may be locked by fixing and/or maintaining the code value of the delay control signal DC when the reference clock signal REFCLK and the first feedback clock signal FBCLK1 have the same phase. In an embodiment, the first delay locked loop 210 may generate the delay locked clock signal CLKDLL by performing a delay-locking operation on the reference clock signal REFCLK to set a delay of the reference clock signal REFCLK when a first feedback clock signal FBCLK1 has the same phase as the reference clock signal REFCLK.

The second delay locked loop 220 may include a second delay line 221, a second phase detector 222 and a charge pump 223. The second delay line 221 may receive the delay locked clock signal CLKDLL output from the first delay locked loop 210. The second delay line 221 may receive a delay control voltage VC and may delay the delay locked clock signal CLKDLL based on the delay control voltage VC to generate a plurality of delayed clock signals. The second delay line 221 may be a voltage-controlled delay line. A delay amount of the second delay line 221 may be set on the basis of the delay control voltage VC, which is an analog signal. The second delay line 221 may delay the delay locked clock signal CLKDLL by the delay amount, which is set by the delay control voltage VC, to generate the plurality of delayed clock signals. The second delay line 221 may output, as the first to fourth internal clock signals ICLKD, QCLKD, IBCLKD and QBCLKD, four among the plurality of delayed clock signals and may output, as a second feedback clock signal FBCLK2, another one among the plurality of delayed clock signals.

The second delay line 221 may include a plurality of delay cells. Although FIG. 2 exemplifies the second delay line 221 having nine delay cells DC1, DC2, DC3, DC4, DC5, DC6, DC7, DC8 and DC9, an embodiment will not be limited thereto. The number of delay cells included in the second delay line 221 may be greater or less than nine. Referring to FIGS. 1 and 2, one delay cell may be set to have delay time corresponding to a quarter of the period of the clock signal CLK. When any one between the first divided clock signal ICLK and the second divided clock signal QCLK output from the division circuit 130 is provided as the reference clock signal REFCLK, the one delay cell may be set to have delay time corresponding to an eighth of the period of the reference clock signal REFCLK. The second delay line 221 may provide, as the first internal clock signal ICLKD, a delayed clock signal output from the first delay cell DC1. The first internal clock signal ICLKD may be provided as the internal reference clock signal. The second delay line 221 may provide, as the second internal clock signal QCLKD, a delayed clock signal output from the third delay cell DC3. The second delay line 221 may provide, as the third internal clock signal IBCLKD, a delayed clock signal output from the fifth delay cell DC5. The second delay line 221 may provide, as the fourth internal clock signal QBCLKD, a delayed clock signal output from the seventh delay cell DC7. The second delay line 221 may provide, as the second feedback clock signal FBCLK2, a delayed clock signal output from the last delay cell DC9.

The second phase detector 222 may receive the internal reference clock signal and the second feedback clock signal FBCLK2. The second phase detector 222 may generate a second phase detection signal PD2 based on the phases of the internal clock signal ICLKD, which is provided as the internal reference clock signal, and the second feedback clock signal FBCLK2. For example, the second phase detection signal PD2 may include an up signal UP and a down signal DN. The second phase detector 222 may enable the up signal UP based on the phase of the internal clock signal ICLKD. The second phase detector 222 may enable the down signal DN based on the phase of the second feedback clock signal FBCLK2. The second phase detector 222 may enable the up signal UP when the phase of the internal clock signal ICLKD transitions from a logic low level to a logic high level. The second phase detector 222 may enable the down signal DN when the phase of the second feedback clock signal FBCLK2 transitions from a logic low level to a logic high level. The second phase detector 222 may reset the up signal UP and the down signal DN when a predetermined time elapses. The second phase detector 222 may disable both of the up signal UP and the down signal DN when the predetermined time elapses from a time point, at which any signal is enabled later than the other signal between the up signal UP and the down signal DN. The predetermined time may be less than a time corresponding to a half of the period of the reference clock signal REFCLK and/or the second feedback clock signal FBCLK2. The word "predetermined" as used herein with respect to a parameter, such as a predetermined time and predetermined amount, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The charge pump 223 may receive the second phase detection signal PD2 and may generate the delay control voltage VC based on the second phase detection signal PD2. The charge pump 223 may raise the voltage level of the delay control voltage VC based on the up signal UP and may lower the voltage level of the delay control voltage VC based on the down signal DN. When the voltage level of the delay control voltage VC rises, the delay time of the delay cells DC1 to DC9 configuring the second phase detector 222 may decrease. When the voltage level of the delay control voltage VC lowers, the delay time of the delay cells DC1 to DC9 configuring the second phase detector 222 may increase. The second delay locked loop 220 may perform a delay-locking operation by changing the value of the delay control voltage VC until the internal reference clock signal and the second feedback clock signal FBCLK2 have the same phase. The second delay locked loop 220 may be locked by fixing and maintaining the voltage level of the delay control voltage VC when the internal reference clock signal and the second feedback clock signal FBCLK2 have the same phase. In an embodiment, the second delay locked loop 220 may generate the internal reference clock signal by performing a delay-locking operation on the delay locked clock signal CLKDLL to set a delay of the delay locked clock signal CLKDLL when a second feedback clock signal FBCLK2 has the same phase as the internal reference clock signal.

Figure 3:
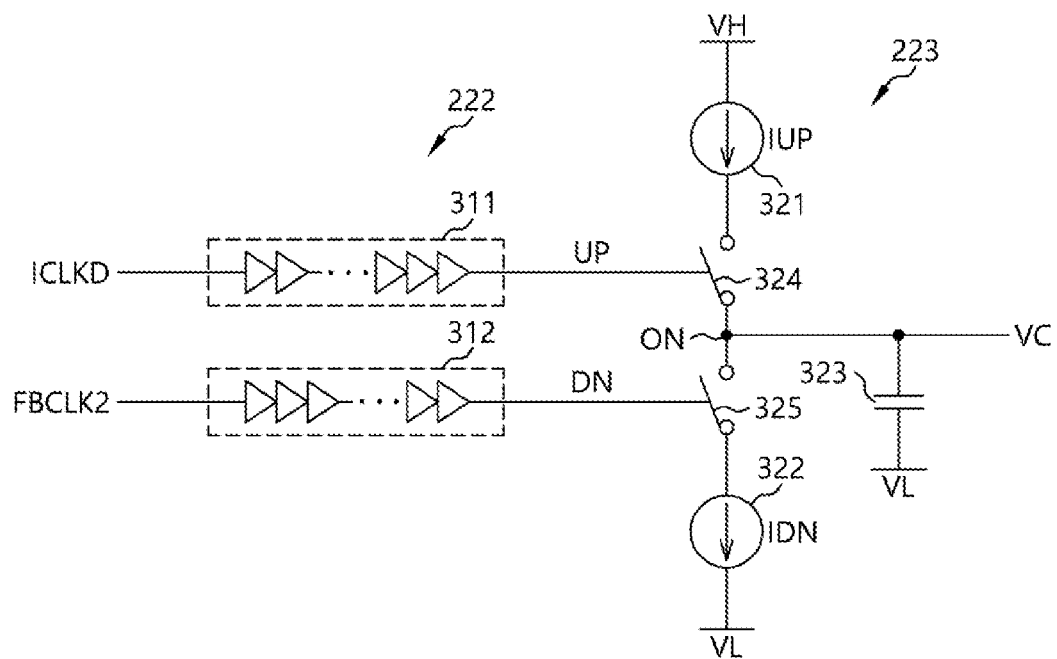
FIG. 3 is a diagram schematically illustrating configurations of a second phase detector and a charge pump illustrated in FIG. 2.

FIG. 3 is a diagram schematically illustrating configurations of the second phase detector 222 and the charge pump 223 illustrated in FIG. 2. The second phase detector 222 may include a first set of plural drivers 311 and a second set of plural drivers 312. The first set of plural drivers 311 may receive the first internal clock signal ICLKD and may generate the up signal UP by driving the first internal clock signal ICLKD. The second set of plural drivers 312 may receive the second feedback clock signal FBCLK2 and may generate the down signal DN by driving the second feedback clock signal FBCLK2.

The charge pump 223 may include a pull-up current source 321, a pull-down current source 322, a capacitor 323, a first switch 324 and a second switch 325. The pull-up current source 321 may be coupled between a node, from which a high voltage VH is provided, and an output node ON. The pull-up current source 321 may generate a pull-up current IUP. The delay control voltage VC may be generated from the output node ON. The pull-up current source 321 may be implemented by at least one P-channel MOS transistor configured to receive a bias voltage or a current control signal. The pull-down current source 322 may be coupled between the output node ON and a node, from which a low voltage VL is provided. The pull-down current source 322 may generate a pull-down current IDN. The low voltage VL may have a lower voltage level than the high voltage VH. The pull-down current source 322 may be implemented by at least one N-channel MOS transistor configured to a bias voltage or a current control signal. The capacitor 323 may be coupled to the output node ON at one end and may be coupled to the node, from which the low voltage VL is provided, at the other node. The voltage level of the output node ON and the delay control voltage VC may change depending on an amount of charge that is charged into the capacitor 323.

The first switch 324 may receive the up signal UP. The first switch 324 may couple the pull-up current source 321 to the output node ON based on the up signal UP. When the first switch 324 is turned on according to the up signal UP, the pull-up current IUP may be provided to the output node ON and the capacitor 323 may be charged. Therefore, the voltage level of the output node ON and the delay control voltage VC may rise. The second switch 325 may receive the down signal DN. The second switch 325 may couple the pull-down current source 322 to the output node ON based on the down signal DN. When the second switch 325 is turned on according to the down signal DN, the pull-down current IDN may flow from the output node ON to the node, from which the low voltage VL is provided, and the capacitor 323 may be discharged. Therefore, the voltage level of the output node ON and the delay control voltage VC may lower.

There may be delay mismatch in the second phase detector 222 due to local process variation between the first set of plural drivers 311 and the second set of plural drivers 312. Therefore, there may occur an error between a time, at which the up signal UP is enabled according to a rising edge of the first internal clock signal ICLKD, and a time, at which the down signal DN is enabled according to a rising edge of the second feedback clock signal FBCLK2. Further, since the pull-up current source 321 is configured by a P-channel MOS transistor and the pull-down current source 322 is configured by an N-channel MOS transistor in the charge pump 223, there may occur an error in sizes between the pull-up current IUP and the pull-down current IDN in spite of size adjustment of the transistors when designed. Therefore, there should occur a phase error between the first internal clock signal ICLKD and the second feedback clock signal FBCLK2 even when the second delay locked loop 220 illustrated in FIG. 2 completes a delay-locking operation. The phase error may be represented by a following equation.

$$\Delta t2 = \Delta t_{MIS} + t_{RESET} * (1 - IUP/IDN)$$

In the above equation, "Δt2" may represent the phase error between the first internal clock signal ICLKD and the second feedback clock signal FBCLK2 when the second delay locked loop 220 is locked, "$\Delta t_{MIS}$" may represent the delay mismatch by the second phase detector 222 and "$t_{RESET}$" may represent the predetermined time when the up signal UP and the down signal DN are reset. In general, in order to improve "Δt2", the amount of the pull-up current IUP and the pull-down current IDN which are provided for the charge pump 223 to generate the delay control voltage VC may be adjusted. However, it may be difficult to implement high resolution by the scheme of adjusting the current amount of the charge pump 223 and the mismatch may occur again between the adjusted pull-up current IUP and pull-down current IDN. Therefore, it may be difficult to fundamentally resolve the phase error between the first internal clock signal ICLKD and the second feedback clock signal FBCLK2.

Figure 4:
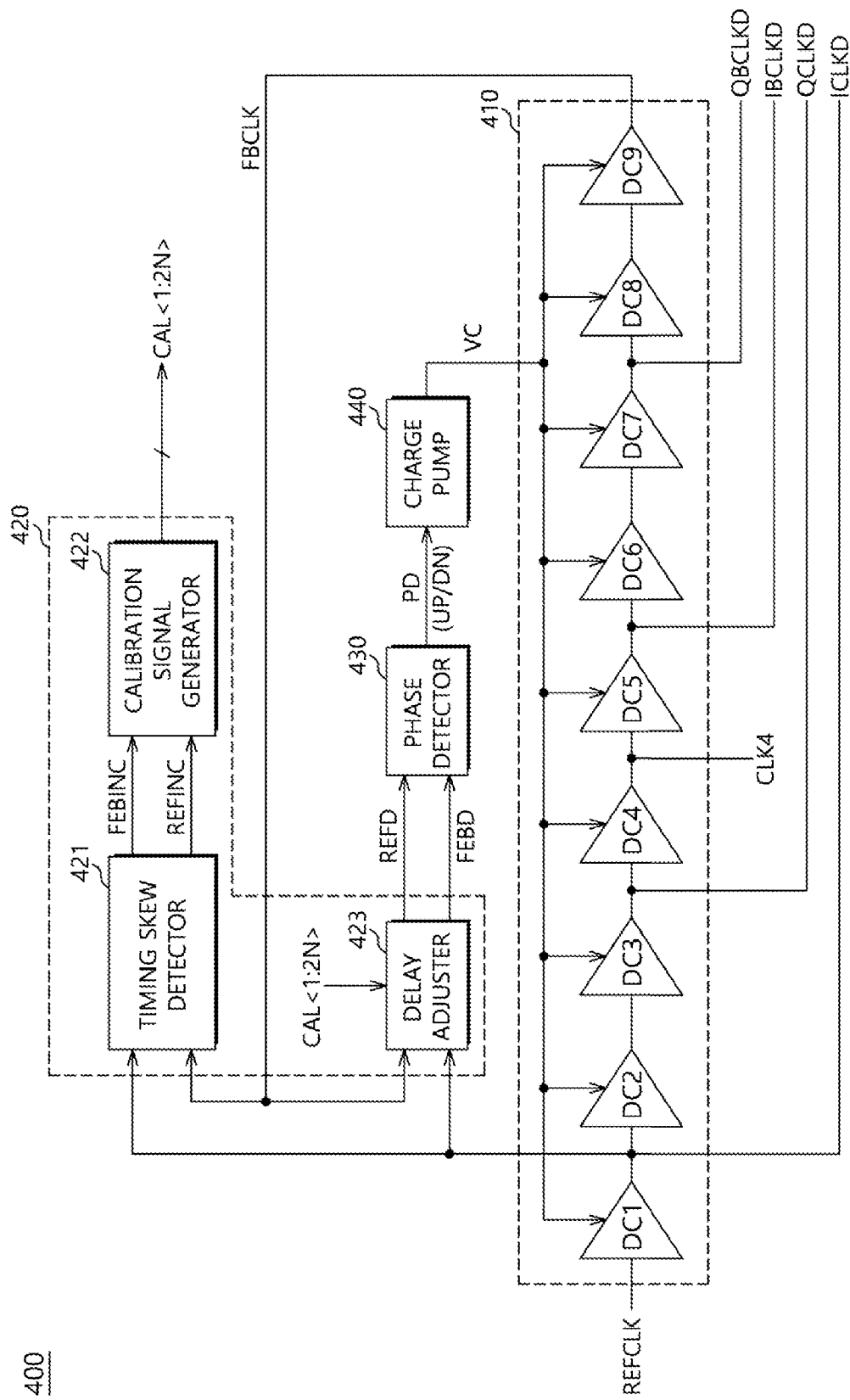
FIG. 4 is a diagram illustrating a configuration of an analog delay locked loop in accordance with an embodiment.

FIG. 4 is a diagram illustrating a configuration of an analog delay locked loop 400 in accordance with an embodiment. The analog delay locked loop 400 may be applied as the second delay locked loop 122 illustrated in FIG. 1. The analog delay locked loop 400 may replace the second delay locked loop 220 illustrated in FIG. 2. The analog delay locked loop 400 may include a delay line 410, a calibration circuit 420, a phase detector 430 and a charge pump 440. The delay line 410 receives the reference clock signal REFCLK and the delay control voltage VC. When the analog delay locked loop 400 replaces the second delay locked loop 220 illustrated in FIG. 2, the reference clock signal REFCLK may correspond to the delay locked clock signal CLKDLL. The delay line 410 may delay the reference clock signal REFCLK based on the delay control voltage VC to generate the plurality of delayed clock signals. The delay line 410 may output one among the plurality of delayed clock signals as the internal reference clock signal and may output another one among the plurality of delayed clock signals as the feedback clock signal FBCLK. The delay line 410 may generate four among the plurality of delayed clock signals, as the first internal clock signal ICLKD, the second internal clock signal QCLKD, the third internal clock signal IBCLKD and the fourth internal clock signal QBCLKD. The delay line 410 may provide the first internal clock signal ICLKD as the internal reference clock signal. The delay line 410 may include a plurality of delay cells DC1 to DC9 respectively configured to output the plurality of delayed clock signals. The configurations of the delay line 410 may be the same as the configurations of the second delay line 221 and thus redundant description about the same elements will be omitted.

The calibration circuit 420 may receive the first internal clock signal ICLKD and the feedback clock signal FBCLK. The calibration circuit 420 may generate a delayed reference clock signal REFD from the reference clock signal based on the phases of the first internal clock signal ICLKD and the feedback clock signal FBCLK. The calibration circuit 420 may generate a delayed feedback clock signal FEBD from the feedback clock signal FBCLK. The calibration circuit 420 may change the delay amount of the first internal clock signal ICLKD and the delay amount of the feedback clock signal FBCLK according to relative phases of the first internal clock signal ICLKD and the feedback clock signal FBCLK. The calibration circuit 420 may delay, for a longer time, a clock signal having a lagging phase to the other clock signal between the first internal clock signal ICLKD and the feedback clock signal FBCLK. For example, when the first internal clock signal ICLKD has a leading phase to the feedback clock signal FBCLK, the calibration circuit 420 may delay the first internal clock signal ICLKD for a first time to generate the delayed reference clock signal REFD and may delay the feedback clock signal FBCLK for a second time to generate the delayed feedback clock signal FEBD. The second time may be longer than the first time. For example, when the first internal clock signal ICLKD has a lagging phase to the feedback clock signal FBCLK, the calibration circuit 420 may delay the first internal clock signal ICLKD for the second time to generate the delayed reference clock signal REFD and may delay the feedback clock signal FBCLK for the first time to generate the delayed feedback clock signal FEBD.

The phase detector 430 may receive the delayed reference clock signal REFD and the delayed feedback clock signal FEBD. The phase detector 430 may detect the phases of the delayed reference clock signal REFD and the delayed feedback clock signal FEBD to generate a phase detection signal PD. The phase detection signal PD may include the up signal UP and the down signal DN. The charge pump 440 may generate the delay control voltage VC based on the phase detection signal PD. The phase detector 430 and the charge pump 440 may have the same configurations and may perform the same operations as the second phase detector 222 and the charge pump 223 illustrated in FIGS. 2 and 3. Redundant description about the same configurations will be omitted.

The calibration circuit 420 may include a timing skew detector 421, a calibration signal generator 422 and a delay adjuster 423. The timing skew detector 421 may detect phase difference between the first internal clock signal ICLKD and the feedback clock signal FBCLK. The timing skew detector 421 may detect the phase difference between the first internal clock signal ICLKD and the feedback clock signal FBCLK to generate a first phase adjustment signal FEBINC and a second phase adjustment signal REFINC. The timing skew detector 421 may detect the phase difference between the first internal clock signal ICLKD and the feedback clock signal FBCLK to generate a first skew detection signal and a second skew detection signal. The timing skew detector 421 may generate the first phase adjustment signal FEBINC and the second phase adjustment signal REFINC according to whether the logic levels of the first skew detection signal and the second skew detection signal stay kept for an time corresponding to at least double of a unit cycle. The time corresponding to at least double of the unit cycle may be a loop bandwidth of the calibration circuit 420 and may represent a period when the calibration circuit 420 is updated. The loop bandwidth of the calibration circuit 420 may be smaller than a loop bandwidth of the analog delay locked loop 400. The period when the calibration circuit 420 is updated may be greater than a period when the analog delay locked loop 400 is updated. In an embodiment, the loop bandwidth of the calibration circuit 420 may be set as three times of the unit cycle or greater. The unit cycle may be determined on the basis of the plurality of delayed clock signals generated from the delay line 410. The unit cycle will be described later.

The calibration signal generator 422 may receive the first phase adjustment signal FEBINC and the second phase adjustment signal REFINC to generate a calibration signal CAL<1:2N>. The calibration signal CAL<1:2N> may be a digital code signal having a plurality of bits. The calibration signal generator 422 may change a value of a part of the calibration signal CAL<1:2N> based on the first phase adjustment signal FEBINC. The calibration signal generator 422 may change a value of a remaining part of the calibration signal CAL<1:2N> based on the second phase adjustment signal REFINC. For example, the calibration signal CAL<1:2N> may have 2N number of bits. Here, N is an integer equal to or greater than 2. The calibration signal generator 422 may change a value of first to $N^{th}$ bits CAL<1:N> of the calibration signal CAL<1:2N> based on the first phase adjustment signal FEBINC. The calibration signal generator 422 may change a value of $(N+1)^{th}$ to $2N^{th}$ bits CAL<N+1:2N> of the calibration signal CAL<1:2N> based on the second phase adjustment signal REFINC. The calibration signal generator 422 may include configurations such as a decoding circuit, a shift register circuit and so forth such that the calibration signal generator 422 decodes the first phase adjustment signal FEBINC and the second phase adjustment signal REFINC and changes a value of the first to $2N^{th}$ bits CAL<1:2N> of the calibration signal CAL<1:2N> according to the result of the decoding.

The delay adjuster 423 may receive the calibration signal CAL<1:2N>. The delay adjuster 423 may delay the first internal clock signal ICLKD based on a part of the calibration signal CAL<1:2N> to generate the delayed reference clock signal REFD. The delay adjuster 423 may delay the feedback clock signal FBCLK based on a remaining part of the calibration signal CAL<1:2N> to generate the delayed feedback clock signal FEBD. The delay adjuster 423 may delay the first internal clock signal ICLKD by a predetermined amount based on the first to $N^{th}$ bits CAL<1:N> of the calibration signal CAL<1:2N> to generate the delayed reference clock signal REFD. The delay adjuster 423 may delay the feedback clock signal FBCLK by a predetermined amount based on the $(N+1)^{th}$ to $2N^{th}$ bits CAL<N+1:2N> of the calibration signal CAL<1:2N> to generate the delayed feedback clock signal FEBD.

Figure 5:
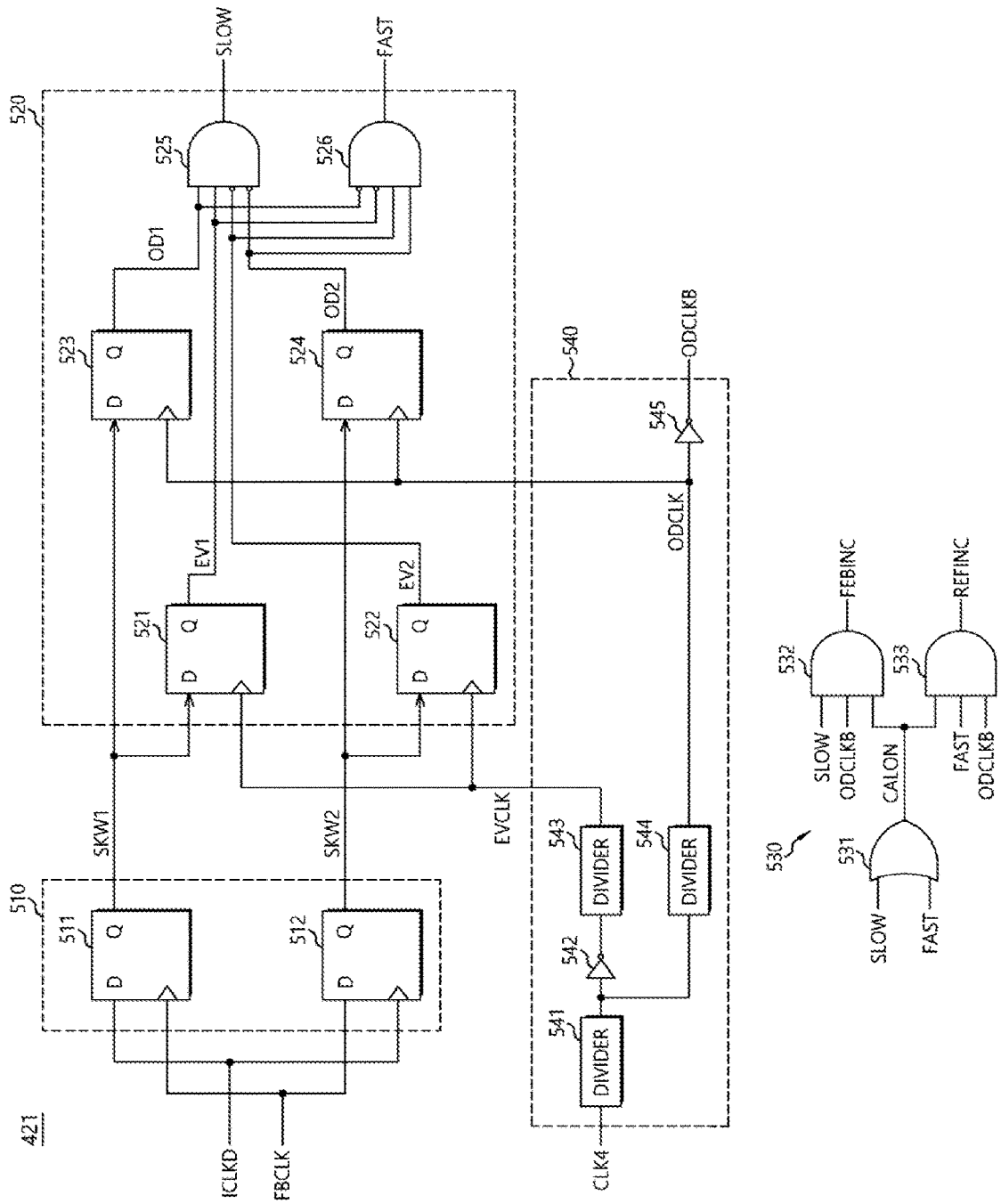
FIG. 5 is a diagram illustrating a configuration of a timing skew detector illustrated in FIG. 4.

FIG. 5 is a diagram illustrating a configuration of timing skew detector 421 illustrated in FIG. 4. Referring to FIG. 5, the timing skew detector 421 may include a skew detector 510, a filter 520 and a phase adjustment signal generator 530. The skew detector 510 may detect the phases of the first internal clock signal ICLKD and the feedback clock signal FBCLK to generate a first skew detection signal SKW1 and a second skew detection signal SKW2. The first skew detection signal SKW1 may include information on whether the first internal clock signal ICLKD has a leading phase or a lagging phase to the feedback clock signal FBCLK. The second skew detection signal SKW2 may include information on whether the feedback clock signal FBCLK has a leading phase or a lagging phase to the first internal clock signal ICLKD.

The filter 520 may receive the first skew detection signal SKW1 and the second skew detection signal SKW2. The filter 520 may generate a first phase information signal SLOW and a second phase information signal FAST based on the first skew detection signal SKW1 and the second skew detection signal SKW2. The first phase information signal SLOW may be enabled when the feedback clock signal FBCLK has a lagging phase to the first internal clock signal ICLKD. The second phase information signal FAST may be enabled with the feedback clock signal FBCLK has a leading phase to the first internal clock signal ICLKD. The filter 520 may define the loop bandwidth of the calibration circuit 420 based on one among the plurality of delayed clock signals. The filter 520 may generate the first phase information signal SLOW and the second phase information signal FAST based on whether the logic levels of the first skew detection signal SKW1 and the second skew detection signal SKW2 stay kept at the same logic level, for a time corresponding to the loop bandwidth.

The phase adjustment signal generator 530 may receive the first phase information signal SLOW and the second phase information signal FAST. The phase adjustment signal generator 530 may generate the first phase adjustment signal FEBINC based on the first phase information signal SLOW. The phase adjustment signal generator 530 may generate the second phase adjustment signal REFINC based on the second phase information signal FAST.

The skew detector 510 may include a first flip-flop 511 and a second flip-flop 512. Each of the first flip-flop 511 and the second flip-flop 512 may be a D flip-flop. The first flip-flop 511 may receive the first internal clock signal ICLKD at its input node D, may receive the feedback clock signal FBCLK at its clock node and may output the first skew detection signal SKW1 at its output node Q. The second flip-flop 512 may receive the feedback clock signal FBCLK at its input node D, may receive the first internal clock signal ICLKD at its clock node and may output the second skew detection signal SKW2 at its output node Q. In order to reduce a malfunction that can occur due to variation of setup times and hold times of the first flip-flop 511 and the second flip-flop 512, the skew detector 510 may detect a skew between phases of the first internal clock signal ICLKD and the feedback clock signal FBCLK in a dual mode.

The filter 520 may include a first flip-flop 521, a second flip-flop 522, a third flip-flop 523, a fourth flop-flop 524, a first gating circuit 525 and a second gating circuit 526. Each of the first to fourth flip-flops 521, 522, 523 and 524 may be a D flip-flop. The first flip-flop 521 may receive the first skew detection signal SKW1 at its input node D, may receive a first clock signal EVCLK at its clock node and may output a first even signal EV1 at its output node Q. The second flip-flop 522 may receive the second skew detection signal SKW2 at its input node D, may receive the first clock signal EVCLK at its clock node and may output a second even signal EV2 at its output node Q. The third flip-flop 523 may receive the first skew detection signal SKW1 at its input node D, may receive a second clock signal ODCLK at its clock node and may output a first odd signal OD1 at its output node Q. The second clock signal ODCLK may have a lagging phase to the first clock signal EVCLK. The fourth flop-flop 524 may receive the second skew detection signal SKW2 at its input node D, may receive the second clock signal ODCLK at its clock node and may output a second odd signal OD2 at its output node Q.

The first gating circuit 525 may receive the first even signal EV1, the first odd signal OD1, the second even signal EV2 and the second odd signal OD2. The first gating circuit 525 may perform an AND operation on the received signals to generate the first phase information signal SLOW. The first gating circuit 525 may include an AND gate. The first gating circuit 525 may receive the first even signal EV1, the first odd signal OD1, an inverted signal of the second even signal EV2 and an inverted signal of the second odd signal OD2 to generate the first phase information signal SLOW. The second gating circuit 526 may receive the first even signal EV1, the first odd signal OD1, the second even signal EV2 and the second odd signal OD2. The second gating circuit 526 may perform an AND operation on the received signal to generate the second phase information signal FAST. The second gating circuit 526 may include an AND gate. The second gating circuit 526 may receive an inverted signal of the first even signal EV1, an inverted signal of the first odd signal OD1, the second even signal EV2 and the second odd signal OD2 to generate the second phase information signal FAST. In order to reduce the loop bandwidth of the calibration circuit 420 and increase the update period of the calibration circuit 420, the filter 520 may further include an additional flip-flop. The additional flip-flop may receive a clock signal having a lagging phase to the second clock signal ODCLK. The gating circuits may be modified to further receive a signal output from the additional flip-flop.

The first gating circuit 525 may output, when the first even signal EV1 and the first odd signal OD1 are of a logic high level and the second even signal EV2 and the second odd signal OD2 are of a logic low level, the first phase information signal SLOW of a logic high level. The second gating circuit 526 may output, when the first even signal EV1 and the first odd signal OD1 are of a logic low level and the second even signal EV2 and the second odd signal OD2 are of a logic high level, the second phase information signal FAST of a logic high level. The first even signal EV1 and the second even signal EV2 may be generated in synchronization with the first clock signal EVCLK. The first odd signal OD1 and the second odd signal OD2 may be generated in synchronization with the second clock signal ODCLK. Therefore, the filter 520 may enable the first phase information signal SLOW and the second phase information signal FAST to a logic high level only when the logic levels of the first skew detection signal SKW1 and the second skew detection signal SKW2 are kept at the logic high level until transitions of the first clock signal EVCLK and the second clock signal ODCLK are generated. In general, a delay locked loop may cause a bang-bang jitter and thus an incorrect calibration operation may be performed in a case of generating phase information signal directly from the first skew detection signal SKW1 and the second skew detection signal SKW2. In accordance with an embodiment, a value of a calibration signal may change according to a phase information signal only when the logic levels of the first skew detection signal SKW1 and the second skew detection signal SKW2 are kept at a same logic level for a predetermined time. Therefore, a precise calibration operation may be performed.

The phase adjustment signal generator 530 may include a first gating circuit 531, a second gating circuit 532 and a third gating circuit 533. The first gating circuit 531 may receive the first phase information signal SLOW and the second phase information signal FAST to generate a calibration enable signal CALON. The first gating circuit 531 may perform an OR operation on the first phase information signal SLOW and the second phase information signal FAST to generate the calibration enable signal CALON. The first gating circuit 531 may include an OR gate. The first gating circuit 531 may enable, when at least one between the first phase information signal SLOW and the second phase information signal FAST is enabled to a logic high level, the calibration enable signal CALON to a logic high level. The second gating circuit 532 may receive the first phase information signal SLOW, the calibration enable signal CALON and a third clock signal ODCLKB. The third clock signal ODCLKB may have a lagging phase to the second clock signal ODCLK. The second gating circuit 532 may perform an AND operation on the first phase information signal SLOW, the calibration enable signal CALON and the third clock signal ODCLKB to generate the first phase adjustment signal FEBINC. The second gating circuit 532 may include an AND gate. The second gating circuit 532 may enable the first phase adjustment signal FEBINC to a logic high level when both of the first phase information signal SLOW and the calibration enable signal CALON are of a logic high level while the third clock signal ODCLKB is of a logic high level. The third gating circuit 533 may receive the second phase information signal FAST, the calibration enable signal CALON and the third clock signal ODCLKB. The third gating circuit 533 may perform an AND operation on the second phase information signal FAST, the calibration enable signal CALON and the third clock signal ODCLKB to generate the second phase adjustment signal REFINC. The third gating circuit 533 may include an AND gate. The third gating circuit 533 may enable the second phase adjustment signal REFINC to a logic high level when both of the second phase information signal FAST and the calibration enable signal CALON are of a logic high level while the third clock signal ODCLKB is of a logic high level.

The timing skew detector 421 may further include a control clock generator 540. The control clock generator 540 may receive one among the plurality of delayed clock signals generated from the voltage-controlled delay line 410 illustrated in FIG. 4. For example, the control clock generator 540 may receive the delayed clock signal CLK4 output from the fourth delay cell DC4 of the voltage-controlled delay line 410. The control clock generator 540 may generate the first clock signal EVCLK, the second clock signal ODCLK and the third clock signal ODCLKB from the delayed clock signal CLK4. The control clock generator 540 may include a first divider 541, a first inverter 542, a second divider 543, a third divider 544 and a second inverter 545. The first divider 541 may divide the delayed clock signal CLK4. The first inverter 542 may invert the output of the first divider 541. The second divider 543 may divide the output of the first inverter 542 to generate the first clock signal EVCLK. The third divider 544 may divide the output of the first divider 541 to generate the second clock signal ODCLK. The second inverter 545 may invert the second clock signal ODCLK to generate the third clock signal ODCLKB.

Figure 6:
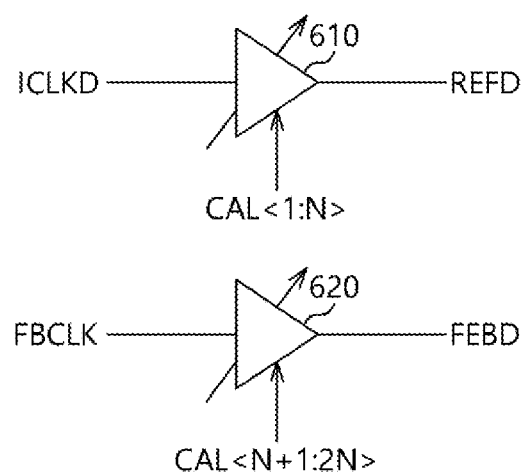
FIG. 6 is a diagram illustrating a configuration of a delay adjuster illustrated in FIG. 4.

FIG. 6 is a diagram illustrating a configuration of the delay adjuster 423 illustrated in FIG. 4. Referring to FIG. 6, the delay adjuster 423 may include a first variable delayer 610 and a second variable delayer 620. The first variable delayer 610 may receive the first internal clock signal ICLKD and the first to $N^{th}$ bits CAL<1:N> of the calibration signal CAL<1:2N> to generate the delayed reference clock signal REFD. A delay amount of the first variable delayer 610 may be set on the basis of the first to $N^{th}$ bits CAL<1:N> of the calibration signal CAL<1:2N>. The first variable delayer 610 may delay the first internal clock signal ICLKD by the set delay time to generate the delayed reference clock signal REFD. The second variable delayer 620 may receive the feedback clock signal FBCLK and the $(N+1)^{th}$ to $2N^{th}$ bits CAL<N+1:2N> of the calibration signal CAL<1:2N> to generate the delayed feedback clock signal FEBD. A delay amount of the second variable delayer 620 may be set on the basis of the $(N+1)^{th}$ to $2N^{th}$ bits CAL<N+1:2N> of the calibration signal CAL<1:2N>. The second variable delayer 620 may delay the feedback clock signal FBCLK by the set delay time to generate the delayed feedback clock signal FEBD.

Figure 7:
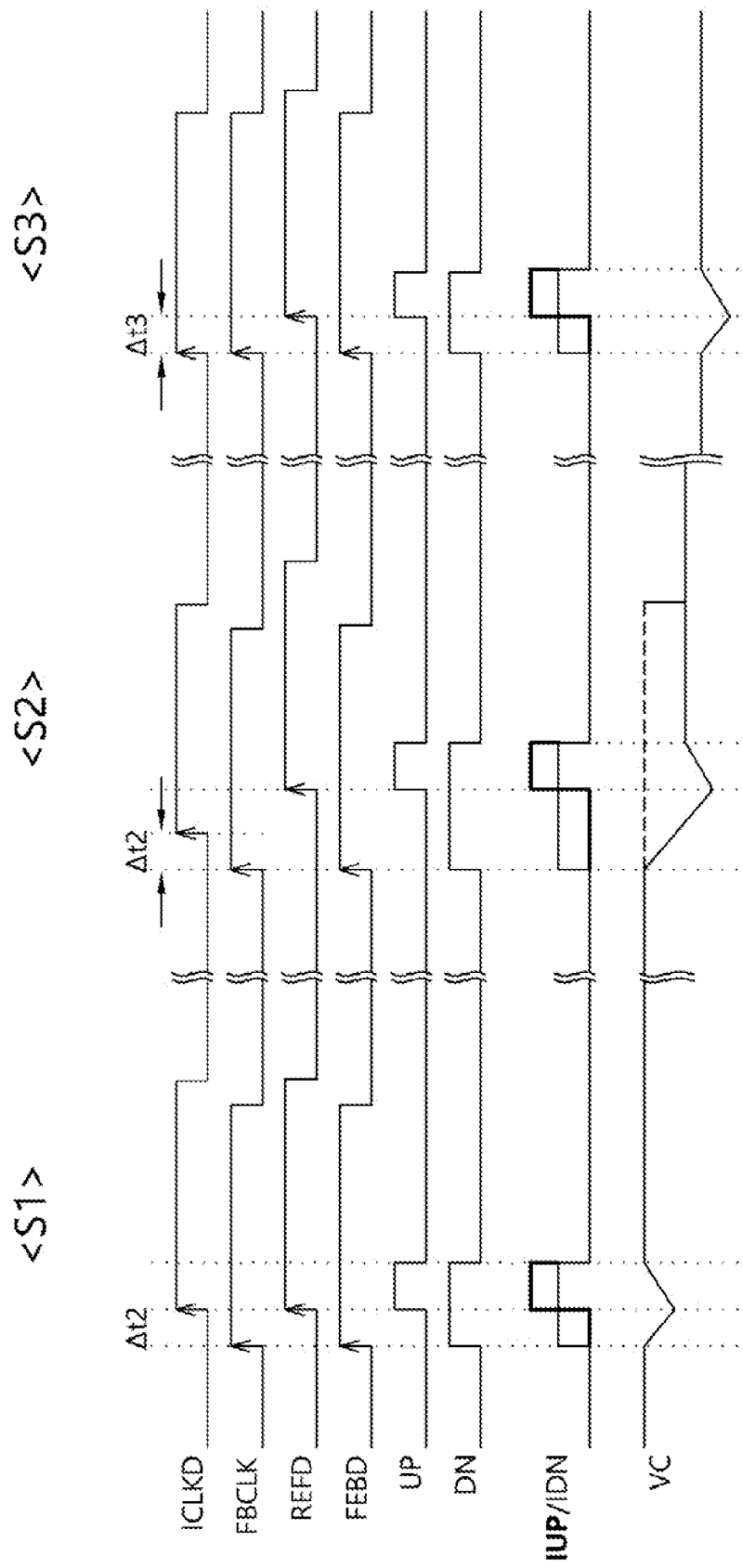
FIG. 7 is a timing diagram illustrating operations of a calibration circuit and an analog delay locked loop in accordance with an embodiment.

FIG. 7 is a timing diagram illustrating operations of the calibration circuit 420 and the analog delay locked loop 400 in accordance with an embodiment. Hereinafter, described with reference to FIGS. 3 to 6 will be the operations of the calibration circuit 420 and the analog delay locked loop 400. In S1, the skew detector 510 of the timing skew detector 421 may detect the phases of the first internal clock signal ICLKD and the feedback clock signal FBCLK to generate the first skew detection signal SKW1 and the second skew detection signal SKW2. As illustrated in FIG. 7, when the first internal clock signal ICLKD has a lagging phase to the feedback clock signal FBCLK due to the phase error "Δt2" caused by the phase detector 430 and the charge pump 440, the skew detector 510 may generate the first skew detection signal SKW1 having a logic low level and the second skew detection signal SKW2 having a logic high level. The calibration signal CAL<1:2N> may keep a default value before update. The delay adjuster 423 may delay the first internal clock signal ICLKD and the feedback clock signal FBCLK by the same time to generate the delayed reference clock signal REFD and the delayed feedback clock signal FEBD. The phase detector 430 may enable the down signal DN when the delayed feedback clock signal FEBD transitions from a logic low level to a logic high level. The phase detector 430 may enable the up signal UP when the first internal clock signal ICLKD transitions from a logic low level to a logic high level. The up signal UP and the down signal DN may stay enabled until reset. A pulse width of the down signal DN may be wider than a pulse width of the up signal UP. In an ideal case, the charge pump 440 should generate the delay control voltage VC having a lower level based on the up signal UP and the down signal DN. However, when the pull-up current IUP is greater than the pull-down current IDN due to the mismatch between the pull-up current IUP and the pull-down current IDN of the charge pump 440, there may occur a malfunction that the voltage level of the delay control voltage VC cannot lower and stays to a previous voltage level. Therefore, it is impossible, only by the phase detector 430 and the charge pump 440, to match the phases of the first internal clock signal ICLKD and the feedback clock signal FBCLK. When the logic levels of the first skew detection signal SKW1 and the second skew detection signal SKW2 are kept at a same logic level for a predetermined time, the filter 520 of the calibration circuit 420 may keep the first phase information signal SLOW disabled and may enable the second phase information signal FAST to a logic high level.

In S2, the phase adjustment signal generator 530 may enable the second phase adjustment signal REFINC according to the second phase information signal FAST. The calibration signal generator 422 may increase the value of the $(N+1)^{th}$ to $2N^{th}$ bits CAL<N+1:2N> of the calibration signal CAL<1:2N>. The delay adjuster 423 may delay the feedback clock signal FBCLK by a relatively longer time to generate the delayed feedback clock signal FEBD. The delay adjuster 423 may delay the first internal clock signal ICLKD by a relatively shorter time to generate the delayed reference clock signal REFD. Therefore, the phase difference between the delayed reference clock signal REFD and the delayed feedback clock signal FEBD may become greater than the phase difference between the first internal clock signal ICLKD and the feedback clock signal FBCLK. The delayed reference clock signal REFD may be further delayed than the delayed feedback clock signal FEBD by a calibrated phase "Δt3", which is set by a calibration operation. The phase detector 430 may enable the down signal DN when the delayed feedback clock signal FEBD transitions from a logic low level to a logic high level. The phase detector 430 may enable the up signal UP when the delayed reference clock signal REFD transitions from a logic low level to a logic high level. The up signal UP and the down signal DN may stay enabled until reset. The up signal UP may have the same pulse width as the up signal UP generated in S1. The down signal DN may have a greater pulse width than the down signal DN generated in S1. The charge pump 440 may pull-down the delay control voltage VC for a longer time according to the down signal DN. Therefore, the voltage level of the delay control voltage VC may lower even when the pull-up current IUP is greater than the pull-down current IDN.

In S3, when the voltage level of the delay control voltage VC lowers, the phased of the first internal clock signal ICLKD and the feedback clock signal FBCLK, which are generated from the delay line 410, may be matched. The delayed reference clock signal REFD and the delayed feedback clock signal FEBD may have lagging phases to the delayed reference clock signal REFD and the delayed feedback clock signal FEBD illustrated in S2. Therefore, the voltage level of the delay control voltage VC may become lower than the voltage level of the delay control voltage VC illustrated in S2. Since the phases of the first internal clock signal ICLKD and the feedback clock signal FBCLK are matched, the calibration circuit 420 may terminate the calibration operation and may keep the value of the calibration signal CAL<1:2N>. The delay adjuster 423 may further delay the first internal clock signal ICLKD with respect to the feedback clock signal FBCLK by the delay time, which is set by the calibration operation, to generate the delayed reference clock signal REFD. Therefore, the delayed reference clock signal REFD may have a lagging phase, by an amount of the calibrated phase "Δt3" that is set by the calibration operation, to the delayed feedback clock signal FEBD. The phase difference between the delayed reference clock signal REFD and the delayed feedback clock signal FEBD may compensate for the phase error "Δt2" caused by the local process variation of the phase detector 430 and the mismatch between pull-up current IUP and the pull-down current IDN of the charge pump 440. The delay control voltage VC generated from the charge pump 440 may keep having a specific level. Therefore, the analog delay locked loop 400 may generate the first internal clock signal ICLKD and the feedback clock signal FBCLK, of which the phases are matched by the calibration circuit 420.

Figure 8A:
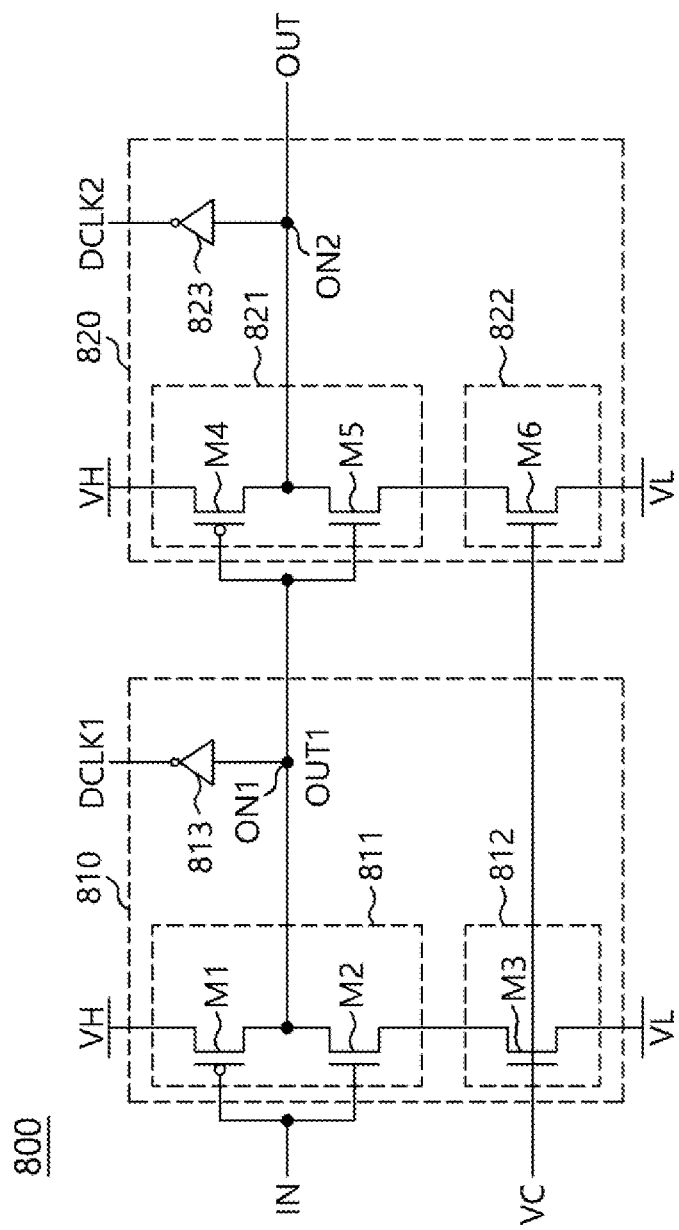
FIG. 8A is a diagram illustrating a configuration of a delay line in accordance with an embodiment.
Figure 8B:
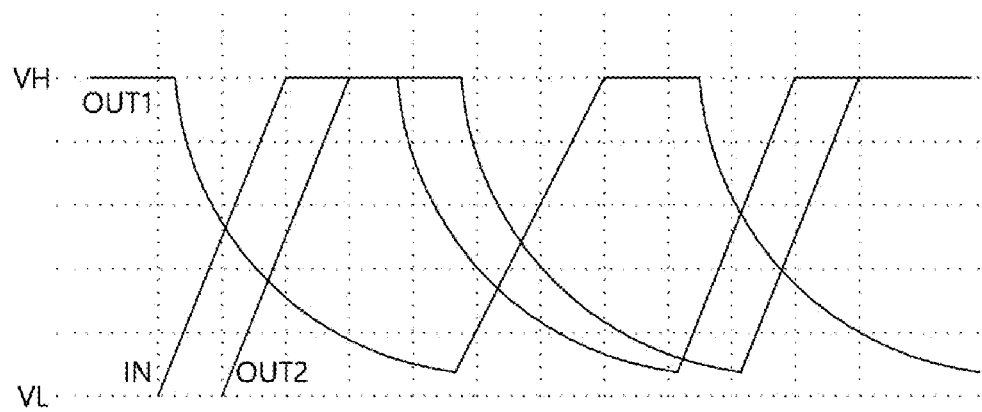
FIG. 8B is a timing diagram illustrating an operation of the delay line illustrated in FIG. 8A.

FIG. 8A is a diagram illustrating a configuration of a delay line 800 in accordance with an embodiment. FIG. 8B is a timing diagram illustrating an operation of the delay line 800 illustrated in FIG. 8A. The delay line 800 may be applied as a part of each of the second delay line 221 and the delay line 410 respectively illustrated in FIGS. 2 and 4. Referring to FIG. 8A, the delay line 800 may include a first delay cell 810 and a second delay cell 820. The first delay cell 810 may invert an input signal IN to generate a first output signal OUT1. The first delay cell 810 may inversion-drive the first output signal OUT1 to output a first delayed clock signal DCLK1. The second delay cell 820 may invert the first output signal OUT1 to generate a second output signal OUT2. The second delay cell 820 may inversion-drive the second output signal OUT2 to output a second delayed clock signal DCLK2. Pull-down driving force, with which the first delay cell 810 pulls down the first output signal OUT1 according to the input signal IN, may change based on the delay control voltage VC. When the pull-down driving force of the first delay cell 810 changes, a delay amount of the first delay cell 810 may change. Pull-down driving force, with which the second delay cell 820 pulls down the second output signal OUT2 according to the first output signal OUT1, may change based on the delay control voltage VC. When the pull-down driving force of the second delay cell 820 changes, a delay amount of the second delay cell 820 may change. In an embodiments, a voltage level outputted from the delay cell may be quickly changed and the delay amount of the delay cell may be decreased as the pull-down driving force of the delay cell is increased. The voltage level outputted from the delay cell may be slowly changed and the delay amount of the delay cell may be increased as the pull-down driving force of the delay cell is decreased.

The first delay cell 810 may include a first inverter 811 and a first current source 812. The first inverter 811 may receive the input signal IN and may invert the input signal IN to generate the first output signal OUT1. The first inverter 811 may be coupled between a node, from which the high voltage VH is provided, and a node, from which the low voltage VL is provided. The first inverter 811 may invert the input signal IN. The high voltage VH may have a higher voltage level than the low voltage VL. The first current source 812 may be coupled between the first inverter 811 and the node, from which the low voltage VL is provided. The first current source 812 may receive the delay control voltage VC. The first current source 812 may change the pull-down driving force of the first inverter 811 based on the delay control voltage VC to change the delay amount of the first delay cell 810. The first delay cell 810 may further include a second inverter 813. The second inverter 813 may inversion-drive the first output signal OUT1 to output the first delayed clock signal DCLK1.

The second delay cell 820 may include a third inverter 821 and a second current source 822. The third inverter 821 may receive the first output signal OUT1 and may invert the first output signal OUT1 to generate the second output signal OUT2. The third inverter 821 may be coupled between the node, from which the high voltage VH is provided, and the node, from which the low voltage VL provided. The third inverter 821 may invert the first output signal OUT1. The second current source 822 may be coupled between the third inverter 821 and the node, from which the low voltage VL is provided. The second current source 822 may receive the delay control voltage VC. The second current source 822 may change the pull-down driving force of the third inverter 821 based on the delay control voltage VC to change the delay amount of the second delay cell 820. The second delay cell 820 may further include a fourth inverter 823. The fourth inverter 823 may inversion-drive the second output signal OUT2 to output the second delayed clock signal DCLK2.

The first inverter 811 may include a first transistor M1 and a second transistor M2. The first transistor M1 may be a P-channel MOS transistor. The second transistor M2 may be a N-channel MOS transistor. The first current source 812 may include a third transistor M3. The third transistor M3 may be a N-channel MOS transistor. The first transistor M1 may receive the input signal IN at its gate, may be coupled to the node, from which the high voltage VH is provided, at its source and may be coupled to a first output node ON1 at its drain. The first output signal OUT1 may be output through the first output node ON1. The second transistor M2 may receive the input signal IN at its gate and may be coupled to the first output node ON1 at its drain. The third transistor M3 may receive the delay control voltage VC at its gate, may be coupled at its drain to the source of the second transistor M2 and may be coupled to the node, from which the low voltage VL is provided, at its source. The third transistor M3 may change an amount of current flowing from the source of the second transistor M2 to the node, from which the low voltage VL is provided, based on the delay control voltage VC.

The third inverter 821 may include a fourth transistor M4 and a fifth transistor M5. The fourth transistor M4 may be a P-channel MOS transistor. The fifth transistor M5 may be a N-channel MOS transistor. The second current source 822 may include a sixth transistor M6. The sixth transistor M6 may be a N-channel MOS transistor. The fourth transistor M4 may receive the first output signal OUT1 at its gate, may be coupled to the node, from which the high voltage VH is provided, at its source and may be coupled to a second output node ON2 at its drain. The second output signal OUT2 may be output through the second output node ON2. The fifth transistor M5 may receive the first output signal OUT1 at its gate and may be coupled to the second output node ON2 at its drain. The sixth transistor M6 may receive the delay control voltage VC at its gate, may be coupled at its drain to the source of the fifth transistor M5 and may be coupled to the node, from which the low voltage VL is provided, at its source. The sixth transistor M6 may change an amount of current flowing from the source of the fifth transistor M5 to the node, from which the low voltage VL is provided, based on the delay control voltage VC.

The delay line 800 has an advantage that the delay amounts of the first delay cell 810 and the second delay cell 820 can change based on the delay control voltage VC, which is an analog signal, and thus the delay variation is reduced and the phase skew is reduced in spite of a high frequency of the input signal IN input to the delay line 800. However, due to the characteristic of the N-channel MOS transistor that loss occurs in a threshold voltage and the voltage level variation that high boundary of the voltage level is increased, there is a problem that the first output signal OUT1 and the second output signal OUT2 cannot fully swing to the voltage level of the low voltage VL, as illustrated in FIG. 8B. When the first output signal OUT1 and the second output signal OUT2 cannot fully swing, a waveform of a final output signal becomes more distorted as a number of delay cells becomes greater and a precise output signal cannot be generated at a high-speed operation.

Figure 9A:
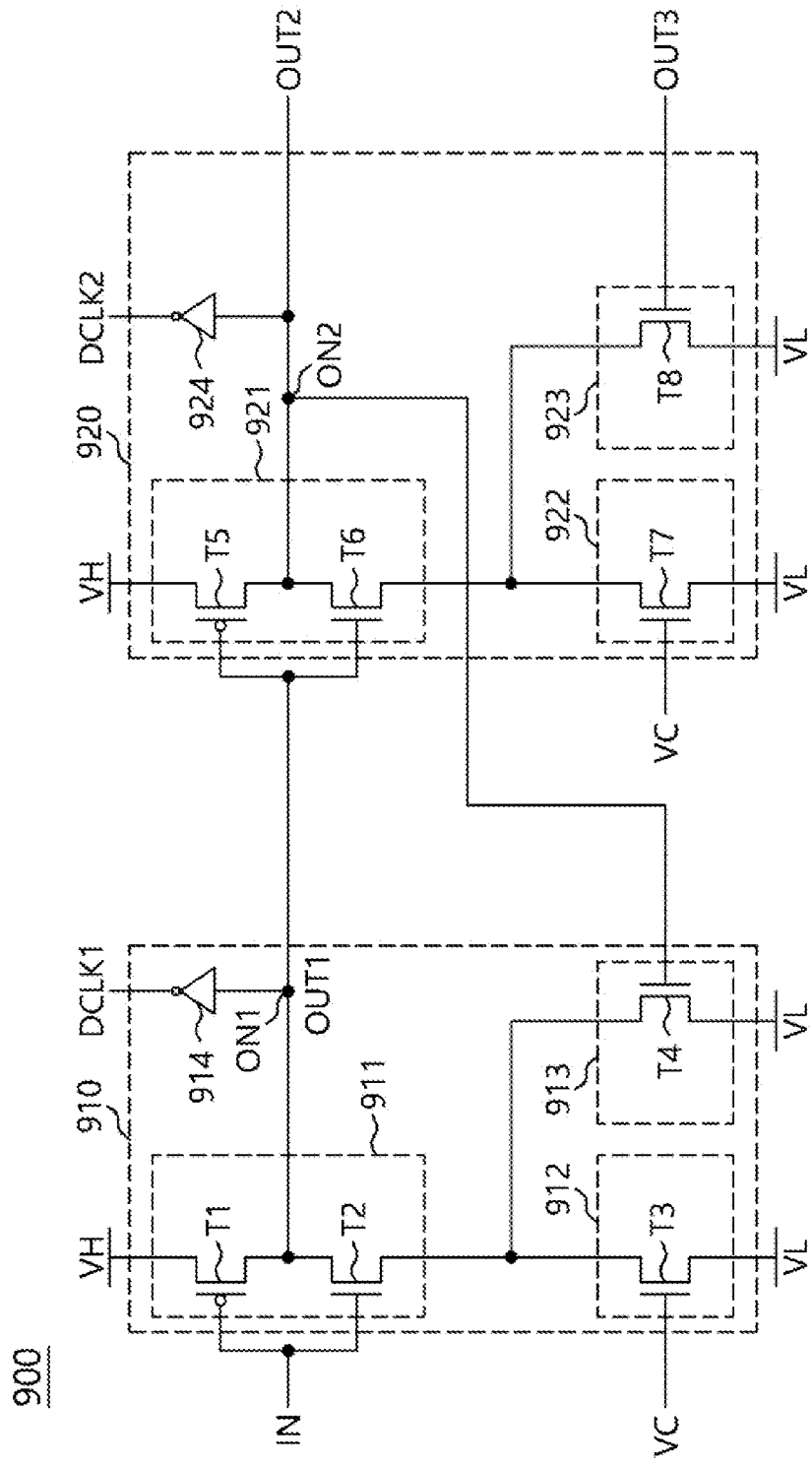
FIG. 9A is a diagram illustrating a configuration of a delay line in accordance with an embodiment.
Figure 9B:
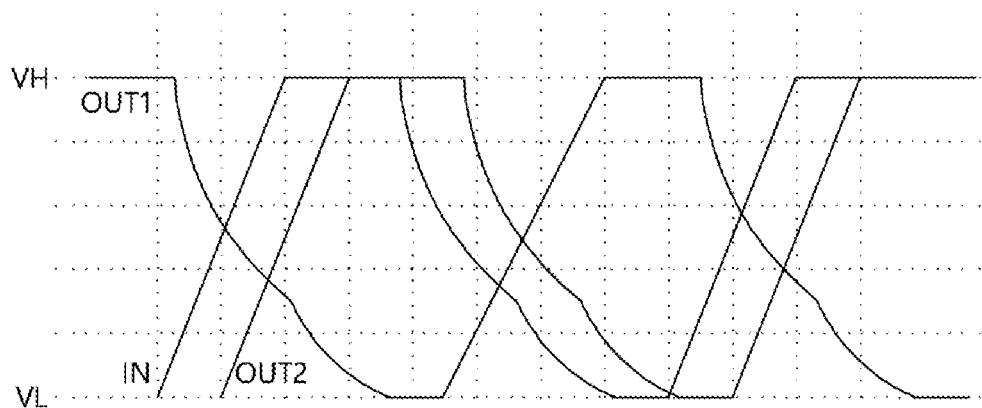
FIG. 9B is a timing diagram illustrating an operation of the delay line illustrated in FIG. 9A.

FIG. 9A is a diagram illustrating a configuration of a delay line 900 in accordance with an embodiment. FIG. 9B is a timing diagram illustrating an operation of the delay line 900 illustrated in FIG. 9A. The delay line 900 may be applied as a part of each of the second delay line 221 and the delay line 410 respectively illustrated in FIGS. 2 and 4. Referring to FIG. 9A, the delay line 900 may include a first delay cell 910 and a second delay cell 920. The first delay cell 910 may invert an input signal IN to generate a first output signal OUT1. The first delay cell 910 may inversion-drive the first output signal OUT1 to output a first delayed clock signal DCLK1. The second delay cell 920 may invert the first output signal OUT1 to generate a second output signal OUT2. The second delay cell 920 may inversion-drive the second output signal OUT2 to output a second delayed clock signal DCLK2. Pull-down driving force, with which the first delay cell 910 pulls down the first output signal OUT1 according to the input signal IN, may change based on the delay control voltage VC and the second output signal OUT2. When the pull-down driving force of the first delay cell 910 changes, a delay amount of the first delay cell 910 may change. Pull-down driving force, with which the second delay cell 920 pulls down the second output signal OUT2 according to the first output signal OUT1, may change based on the delay control voltage VC. When the pull-down driving force of the second delay cell 920 changes, a delay amount of the second delay cell 920 may change. In an embodiment, the second delay cell 920 may further receive an output signal OUT3 output from a subsequent delay cell, which is disposed subsequently to the second delay cell 920 and configured to receive the second output signal OUT2. The pull-down driving force and the delay amount of the second delay cell 920 may change based on the delay control voltage VC and the output signal OUT3 output from the subsequent delay cell.

The first delay cell 910 may include a first inverter 911, a first current source 912 and a first feedback current source 913. The first inverter 911 may receive the input signal IN and may invert the input signal IN to generate the first output signal OUT1. The first inverter 911 may be coupled between a node, from which the high voltage VH is provided, and a node, from which the low voltage VL is provided. The first inverter 911 may invert the input signal IN. The first current source 912 may be coupled between the first inverter 911 and the node, from which the low voltage VL is provided. The first current source 912 may receive the delay control voltage VC. The first current source 912 may change the pull-down driving force of the first inverter 911 based on the delay control voltage VC to change the delay amount of the first delay cell 910. The first feedback current source 913 may be coupled between the first inverter 911 and the node, from which the low voltage VL is provided. The first feedback current source 913 may receive the second output signal OUT2. The first feedback current source 913 may further change the pull-down driving force of the first inverter 911 based on the second output signal OUT2. The first delay cell 910 may further include a second inverter 914. The second inverter 914 may inversion-drive the first output signal OUT1 to output the first delayed clock signal DCLK1.

The second delay cell 920 may include a third inverter 921, a second current source 922 and a second feedback current source 923. The third inverter 921 may receive the first output signal OUT1 and may invert the first output signal OUT1 to generate the second output signal OUT2. The third inverter 921 may be coupled between the node, from which the high voltage VH is provided, and the node, from which the low voltage VL is provided. The third inverter 921 may invert the first output signal OUT1. The second current source 922 may be coupled between the third inverter 921 and the node, from which the low voltage VL is provided. The second current source 922 may receive the delay control voltage VC. The second current source 922 may change the pull-down driving force of the third inverter 921 based on the delay control voltage VC to change the delay amount of the second delay cell 920. The second feedback current source 923 may be coupled between the third inverter 921 and the node, from which the low voltage VL is provided. The second feedback current source 923 may receive the output signal OUT3 output from the subsequent delay cell. The second feedback current source 923 may further change the pull-down driving force of the third inverter 921 based on the output signal OUT3 output from the subsequent delay cell. The second delay cell 920 may further include a fourth inverter 924. The fourth inverter 924 may inversion-drive the second output signal OUT2 to output the second delayed clock signal DCLK2.

The first inverter 911 may include a first transistor T1 and a second transistor T2. The first transistor T1 may be a P-channel MOS transistor. The second transistor T2 may be a N-channel MOS transistor. The first current source 912 may include a third transistor T3. The third transistor T3 may be a N-channel MOS transistor. The first feedback current source 913 may include a fourth transistor T4. The fourth transistor T4 may be a N-channel MOS transistor. The first transistor T1 may receive the input signal IN at its gate, may be coupled to the node, from which the high voltage VH is provided, at its source and may be coupled to a first output node ON1 at its drain. The first output signal OUT1 may be output through the first output node ON1. The second transistor T2 may receive the input signal IN at its gate and may be coupled to the first output node ON1 at its drain. The third transistor T3 may receive the delay control voltage VC at its gate, may be coupled at its drain to the source of the second transistor T2 and may be coupled to the node, from which the low voltage VL is provided, at its source. The third transistor T3 may change an amount of current flowing from the source of the second transistor T2 to the node, from which the low voltage VL is provided, based on the delay control voltage VC. The fourth transistor T4 may receive the second output signal OUT2 at its gate, may be coupled at its drain to the source of the second transistor T2 and may be coupled to the node, from which the low voltage VL is provided, at its source. The fourth transistor T4 may further change the amount of current flowing from the source of the second transistor T2 to the node, from which the low voltage VL is provided, based on the second output signal OUT2.

The third inverter 921 may include a fifth transistor T5 and a sixth transistor T6. The fifth transistor T5 may be a P-channel MOS transistor. The sixth transistor T6 may be a N-channel MOS transistor. The second current source 922 may include a seventh transistor T7. The seventh transistor T7 may be a N-channel MOS transistor. The second feedback current source 923 may include an eighth transistor T8. The eighth transistor T8 may be a N-channel MOS transistor. The fifth transistor T5 may receive the first output signal OUT1 at its gate, may be coupled to the node, from which the high voltage VH is provided, at its source and may be coupled to a second output node ON2 at its drain. The second output signal OUT2 may be output through the second output node ON2. The sixth transistor T6 may receive the first output signal OUT1 at its gate and may be coupled to the second output node ON2 at its drain. The seventh transistor T7 may receive the delay control voltage VC at its gate, may be coupled at its drain to the source of the sixth transistor T6 and may be coupled to the node, from which the low voltage VL is provided, at its source. The seventh transistor T7 may change an amount of current flowing from the source of the sixth transistor T6 to the node, from which the low voltage VL is provided, based on the delay control voltage VC. The eighth transistor T8 may receive at its gate the output signal OUT3 output from the subsequent delay cell, may be coupled at its drain to the source of the sixth transistor T6 and may be coupled to the node, from which the low voltage VL is provided, at its source. The eighth transistor T8 may further change the amount of current flowing from the source of the sixth transistor T6 to the node, from which the low voltage VL is provided, based on the output signal OUT3 output from the subsequent delay cell.

The delay line 900 may solve the problem, as illustrated in FIG. 8B, that the first output signal OUT1 and the second output signal OUT2 cannot fully swing. The first feedback current source 913 and the second feedback current source 923 may further increase the amounts of current respectively flowing from the first inverter 911 and the third inverter 921 to the node, from which the low voltage VL is provided, to further change the pull-down driving force of the first delay cell 910 and the second delay cell 920. As illustrated in FIG. 9B, the first feedback current source 913 and the second feedback current source 923 may respectively receive the output signals fed-back from the delay cells disposed subsequently thereto and thus may further change the pull-down driving force of the first delay cell 910 and the second delay cell 920. Therefore, the first feedback current source 913 and the second feedback current source 923 may allow the first output signal OUT1 and the second output signal OUT2 to fully swing to the level of the low voltage VL. The first feedback current source 913 and the second feedback current source 923 may operate after the logic level of the fed-back output signal transitions. Therefore, the first feedback current source 913 and the second feedback current source 923 may pull-down the first output signal OUT1 and the second output signal OUT2 to the level of the low voltage VL but the delay amounts of the delay cell 910 and the second delay cell 920 may not substantially change.

Figure 10A:
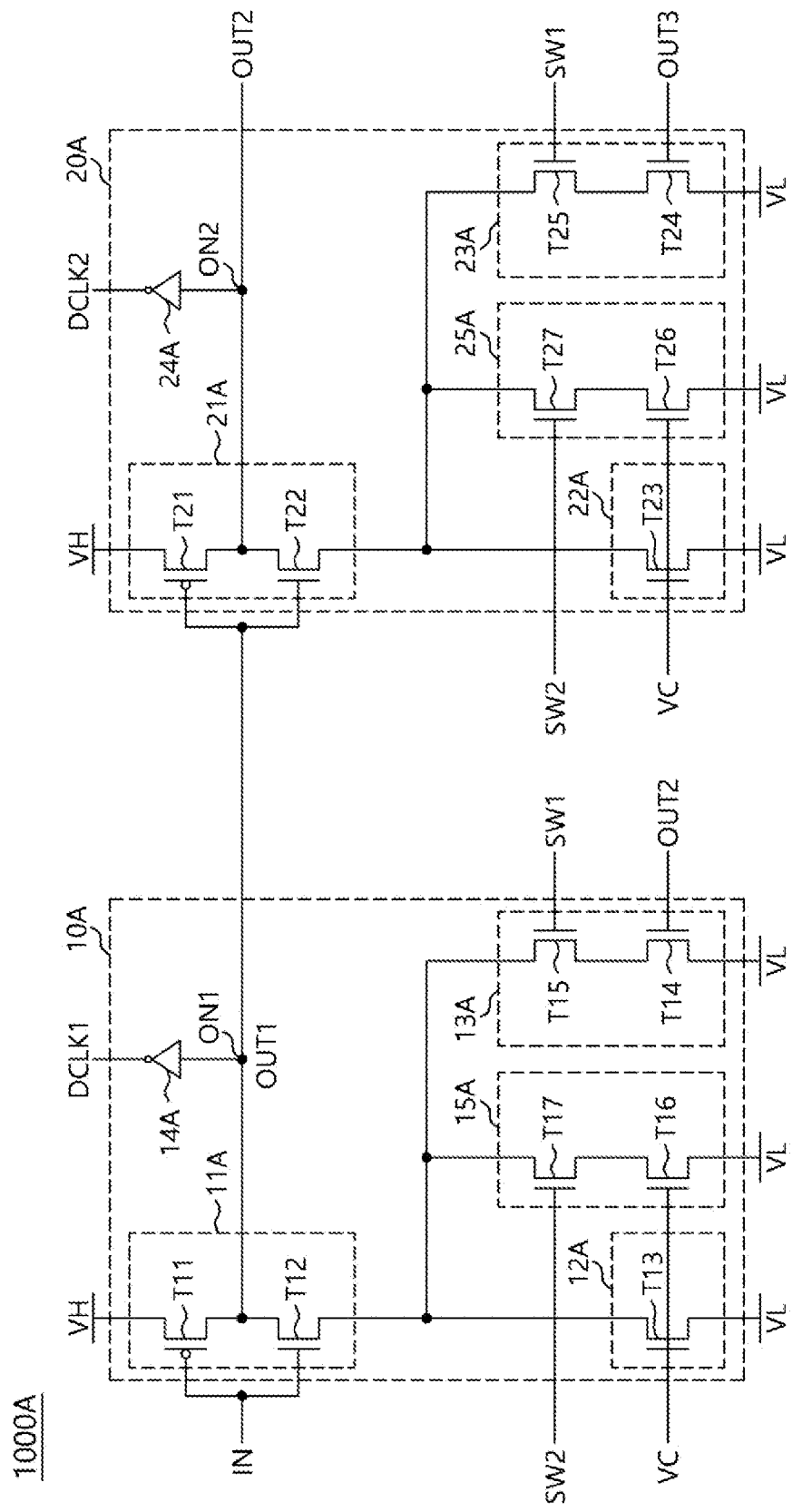
FIGS. 10A, 10B, and 10C are diagrams illustrating configurations of delay lines in accordance with an embodiment.
Figure 10B:
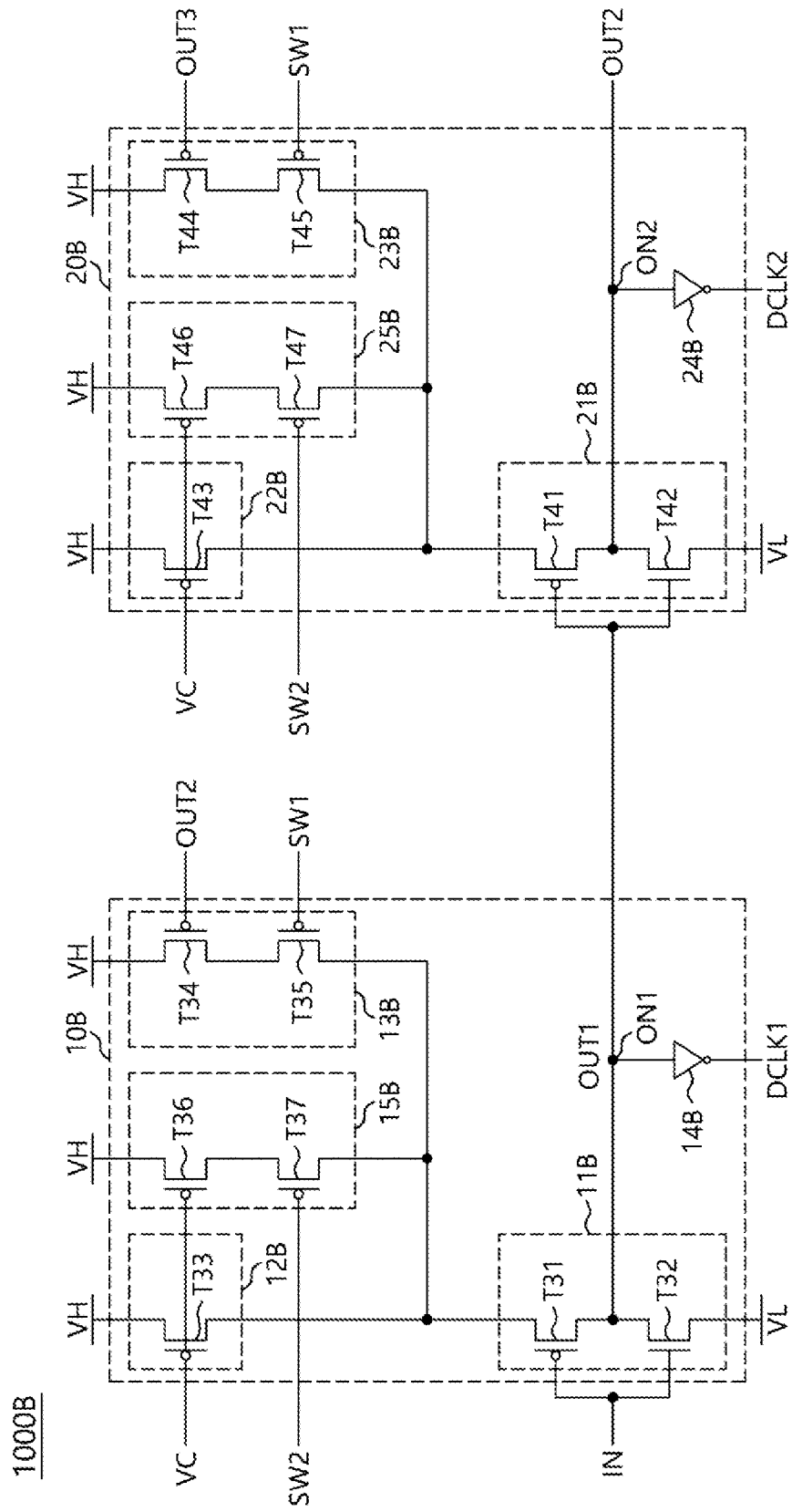
Figure 10C:
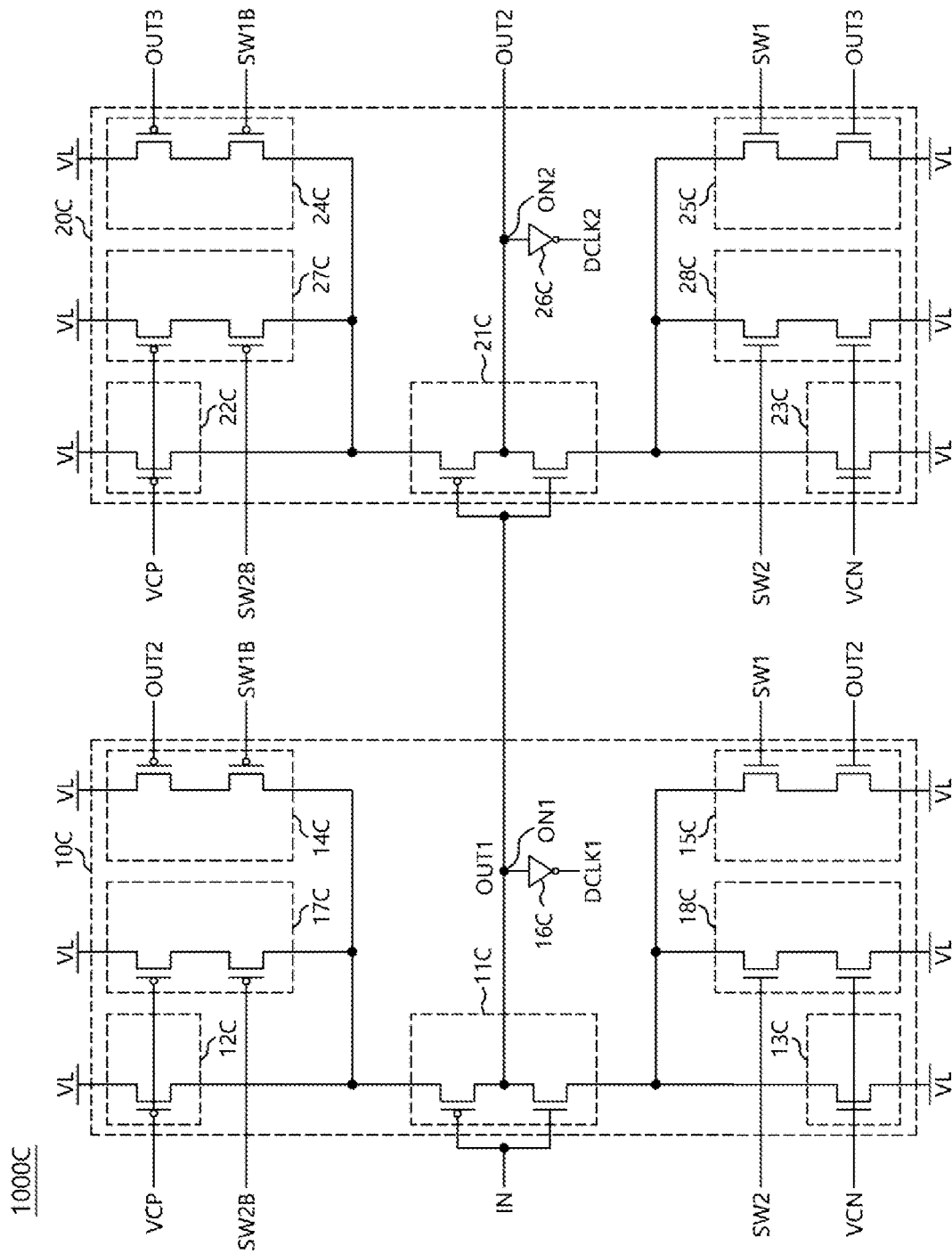

FIGS. 10A to 10C are diagrams illustrating configurations of delay lines 1000A, 1000B and 1000C in accordance with an embodiment. Each of the delay lines 1000A, 1000B and 1000C may be applied as a part of each of the second delay line 221 and the delay line 410 respectively illustrated in FIGS. 2 and 4. Referring to FIG. 10A, the delay line 1000A may include a first delay cell 10A and a second delay cell 20A. The first delay cell 10A may invert an input signal IN to generate a first output signal OUT1. The first delay cell 10A may inversion-drive the first output signal OUT1 to output a first delayed clock signal DCLK1. The second delay cell 20A may invert the first output signal OUT1 to generate a second output signal OUT2. The second delay cell 20A may inversion-drive the second output signal OUT2 to output a second delayed clock signal DCLK2. Pull-down driving force, with which the first delay cell 10A pulls down the first output signal OUT1 according to the input signal IN, may change based on the delay control voltage VC and the second output signal OUT2. Pull-down driving force, with which the second delay cell 20A pulls down the second output signal OUT2 according to the first output signal OUT1, may change based on the delay control voltage VC and an output signal OUT3 output from a subsequent delay cell, which is disposed subsequently to the second delay cell 20A and configured to receive the second output signal OUT2.

The first delay cell 10A may include a first inverter 11A, a first current source 12A and a first feedback current source 13A. The first inverter 11A may receive the input signal IN and may invert the input signal IN to generate the first output signal OUT1. The first inverter 11A may be coupled between a node, from which the high voltage VH is provided, and a node, from which the low voltage VL is provided. The first inverter 11A may invert the input signal IN. The first current source 12A may be coupled between the first inverter 11A and the node, from which the low voltage VL is provided. The first current source 12A may receive the delay control voltage VC. The first current source 12A may change the pull-down driving force of the first inverter 11A based on the delay control voltage VC to change the delay amount of the first delay cell 10A. The first feedback current source 13A may be coupled between the first inverter 11A and the node, from which the low voltage VL is provided. The first feedback current source 13A may receive the second output signal OUT2. The first feedback current source 13A may further change the pull-down driving force of the first inverter 11A based on the second output signal OUT2. In an embodiment, the first feedback current source 13A may further receive a first switching signal SW1. The first feedback current source 13A may be selectively coupled to the first inverter 11A according to the first switching signal SW1. The first delay cell 10A may further include a second inverter 14A. The second inverter 14A may inversion-drive the first output signal OUT1 to output the first delayed clock signal DCLK1.

In an embodiment, the first delay cell 10A may further include a first auxiliary current source 15A. The first auxiliary current source 15A may be coupled between the first inverter 11A and the node, from which the low voltage VL is provided. The first auxiliary current source 15A may receive the delay control voltage VC. The first auxiliary current source 15A may further change the pull-down driving force of the first inverter 11A based on the delay control voltage VC. In an embodiment, the first auxiliary current source 15A may further receive a second switching signal SW2. The first auxiliary current source 15A may be selectively coupled to the first inverter 11A according to the second switching signal SW2.

The second delay cell 20A may include a third inverter 21A, a second current source 22A and a second feedback current source 23A. The third inverter 21A may receive the first output signal OUT1 and may invert the first output signal OUT1 to generate the second output signal OUT2. The third inverter 21A may be coupled between the node, from which the high voltage VH is provided, and the node, from which the low voltage VL is provided. The third inverter 21A may invert the first output signal OUT1. The second current source 22A may be coupled between the third inverter 21A and the node, from which the low voltage VL is provided. The second current source 22A may receive the delay control voltage VC. The second current source 22A may change the pull-down driving force of the third inverter 21A based on the delay control voltage VC to change the delay amount of the second delay cell 20A. The second feedback current source 23A may be coupled between the third inverter 21A and the node, from which the low voltage VL is provided. The second feedback current source 23A may receive the output signal OUT3 output from the subsequent delay cell. The second feedback current source 23A may further change the pull-down driving force of the third inverter 21A based on the output signal OUT3 output from the subsequent delay cell. In an embodiment, the second feedback current source 23A may further receive the first switching signal SW1. The second feedback current source 23A may be selectively coupled to the third inverter 21A according to the first switching signal SW1. The second delay cell 20A may further include a fourth inverter 24A.

The fourth inverter 24A may inversion-drive the second output signal OUT2 to output the second delayed clock signal DCLK2.

In an embodiment, the second delay cell 20A may further include a second auxiliary current source 25A. The second auxiliary current source 25A may be coupled between the third inverter 21A and the node, from which the low voltage VL is provided. The second auxiliary current source 25A may receive the delay control voltage VC. The second auxiliary current source 25A may further change the pull-down driving force of the third inverter 21A based on the delay control voltage VC. In an embodiment, the second auxiliary current source 25A may further receive the second switching signal SW2. The second auxiliary current source 25A may be selectively coupled to the third inverter 21A according to the second switching signal SW2.

The first inverter 11A may include a first transistor T11 and a second transistor T12. The first transistor T11 may be a P-channel MOS transistor. The second transistor T12 may be a N-channel MOS transistor. The first current source 12A may include a third transistor T13. The third transistor T13 may be a N-channel MOS transistor. The first feedback current source 13A may include a fourth transistor T14 and a fifth transistor T15. Each of the fourth transistor T14 and the fifth transistor T15 may be a N-channel MOS transistor. The first auxiliary current source 15A may include a sixth transistor T16 and a seventh transistor T17. Each of the sixth transistor T16 and the seventh transistor T17 may be a N-channel MOS transistor. The first transistor T11 may receive the input signal IN at its gate, may be coupled to the node, from which the high voltage VH is provided, at its source and may be coupled to a first output node ON1 at its drain. The first output signal OUT1 may be output through the first output node ON1. The second transistor T12 may receive the input signal IN at its gate and may be coupled to the first output node ON1 at its drain. The third transistor T13 may receive the delay control voltage VC at its gate, may be coupled at its drain to the source of the second transistor T12 and may be coupled to the node, from which the low voltage VL is provided, at its source. The third transistor T13 may change an amount of current flowing from the source of the second transistor T12 to the node, from which the low voltage VL is provided, based on the delay control voltage VC. The fourth transistor T14 may receive the second output signal OUT2 at its gate and may be coupled to the node, from which the low voltage VL is provided, at its source. The fifth transistor T15 may receive the first switching signal SW1 at its gate, may be coupled at its drain to the source of the second transistor T12 and may be coupled at its source to the drain of the fourth transistor T14. The fourth transistor T14 may further change the amount of current flowing from the source of the second transistor T12 to the node, from which the low voltage VL is provided, based on the second output signal OUT2. The fifth transistor T15 may selectively couple the fourth transistor T14 to the source of the second transistor T12 based on the first switching signal SW1. The sixth transistor T16 may receive the delay control voltage VC at its gate and may be coupled to the node, from which the low voltage VL is provided, at its source. The seventh transistor T17 may receive the second switching signal SW2 at its gate, may be coupled at its drain to the source of the second transistor T12 and may be coupled at its source to the drain of the sixth transistor T16. The sixth transistor T16 may further change the amount of current flowing from the source of the second transistor T12 to the node, from which the low voltage VL is provided, based on the delay control voltage VC. The seventh transistor T17 may selectively couple the sixth transistor T16 to the source of the second transistor T12 based on the second switching signal SW2.

The third inverter 21A may include a first transistor T21 and a second transistor T22. The first transistor T21 may be a P-channel MOS transistor. The second transistor T22 may be a N-channel MOS transistor. The second current source 22A may include a third transistor T23. The third transistor T23 may be a N-channel MOS transistor. The second feedback current source 23A may include a fourth transistor T24 and a fifth transistor T25. Each of the fourth transistor T24 and the fifth transistor T25 may be a N-channel MOS transistor. The second auxiliary current source 25A may include a sixth transistor T26 and a seventh transistor T27. Each of the sixth transistor T26 and the seventh transistor T27 may be a N-channel MOS transistor. The first transistor T21 may receive the first output signal OUT1 at its gate, may be coupled to the node, from which the high voltage VH is provided, at its source and may be coupled to a second output node ON2 at its drain. The second output signal OUT2 may be output through the second output node ON2. The second transistor T22 may receive the first output signal OUT1 at its gate and may be coupled to the second output node ON2 at its drain. The third transistor T23 may receive the delay control voltage VC at its gate, may be coupled at its drain to the source of the second transistor T22 and may be coupled to the node, from which the low voltage VL is provided, at its source. The third transistor T23 may change an amount of current flowing from the source of the second transistor T22 to the node, from which the low voltage VL is provided, based on the delay control voltage VC. The fourth transistor T24 may receive at its gate the output signal OUT3 output from the subsequent delay cell and may be coupled to the node, from which the low voltage VL is provided, at its source. The fifth transistor T25 may receive the first switching signal SW1 at its gate, may be coupled at its drain to the source of the second transistor T22 and may be coupled at its source to the drain of the fourth transistor T24. The fourth transistor T24 may further change the amount of current flowing from the source of the second transistor T22 to the node, from which the low voltage VL is provided, based on the output signal OUT3 output from the subsequent delay cell. The fifth transistor T25 may selectively couple the fourth transistor T24 to the source of the second transistor T22 based on the first switching signal SW1. The sixth transistor T26 may receive the delay control voltage VC at its gate and may be coupled to the node, from which the low voltage VL is provided, at its source. The seventh transistor T27 may receive the second switching signal SW2 at its gate, may be coupled at its drain to the source of the second transistor T22 and may be coupled at its source to the drain of the sixth transistor T26. The sixth transistor T26 may further change the amount of current flowing from the source of the second transistor T22 to the node, from which the low voltage VL is provided, based on the delay control voltage VC. The seventh transistor T27 may selectively couple the sixth transistor T26 to the source of the second transistor T22 based on the second switching signal SW2.

Referring to FIG. 10B, the delay line 1000B may include a first delay cell 10B and a second delay cell 20B. The first delay cell 10B may invert an input signal IN to generate a first output signal OUT1. The first delay cell 10B may inversion-drive the first output signal OUT1 to output a first delayed clock signal DCLK1. The second delay cell 20B may invert the first output signal OUT1 to generate a second output signal OUT2. The second delay cell 20B may inversion-drive the second output signal OUT2 to output a second delayed clock signal DCLK2. Pull-up driving force, with which the first delay cell 10B pulls up the first output signal OUT1 according to the input signal IN, may change based on the delay control voltage VC and the second output signal OUT2. Pull-up driving force, with which the second delay cell 20B pulls up the second output signal OUT2 according to the first output signal OUT1, may change based on the delay control voltage VC and an output signal OUT3 output from a subsequent delay cell, which is disposed subsequently to the second delay cell 20B and configured to receive the second output signal OUT2. In an embodiments, a voltage level outputted from the delay cell may be quickly changed and the delay amount of the delay cell may be decreased as the pull-up driving force of the delay cell is increased. The voltage level outputted from the delay cell may be slowly changed and the delay amount of the delay cell may be increased as the pull-up driving force of the delay cell is decreased.

The first delay cell 10B may include a first inverter 11B, a first current source 12B and a first feedback current source 13B. The first inverter 11B may receive the input signal IN and may invert the input signal IN to generate the first output signal OUT1. The first inverter 11B may be coupled between a node, from which the high voltage VH is provided, and a node, from which the high voltage VL is provided. The first inverter 11B may invert the input signal IN. The first current source 12B may be coupled between the first inverter 11B and the node, from which the high voltage VH is provided. The first current source 12B may receive the delay control voltage VC. The first current source 12B may change the pull-up driving force of the first inverter 11B based on the delay control voltage VC to change the delay amount of the first delay cell 10B. The first feedback current source 13B may be coupled between the first inverter 11B and the node, from which the high voltage VH is provided. The first feedback current source 13B may receive the second output signal OUT2. The first feedback current source 13B may further change the pull-up driving force of the first inverter 11B based on the second output signal OUT2. In an embodiment, the first feedback current source 13B may further receive a first switching signal SW1. The first feedback current source 13B may be selectively coupled to the first inverter 11B according to the first switching signal SW1. The first delay cell 10B may further include a second inverter 14B. The second inverter 14B may inversion-drive the first output signal OUT1 to output the first delayed clock signal DCLK1.

In an embodiment, the first delay cell 10B may further include a first auxiliary current source 15B. The first auxiliary current source 15B may be coupled between the first inverter 11B and the node, from which the high voltage VH is provided. The first auxiliary current source 15B may receive the delay control voltage VC. The first auxiliary current source 15B may further change the pull-up driving force of the first inverter 11B based on the delay control voltage VC. In an embodiment, the first auxiliary current source 15B may further receive a second switching signal SW2. The first auxiliary current source 15B may be selectively coupled to the first inverter 11B according to the second switching signal SW2.

The second delay cell 20B may include a third inverter 21B, a second current source 22B and a second feedback current source 23B. The third inverter 21B may receive the first output signal OUT1 and may invert the first output signal OUT1 to generate the second output signal OUT2. The third inverter 21B may be coupled between the node, from which the high voltage VH is provided, and the node, from which the high voltage VL is provided. The third inverter 21B may invert the first output signal OUT1. The second current source 22B may be coupled between the third inverter 21B and the node, from which the high voltage VH is provided. The second current source 22B may receive the delay control voltage VC. The second current source 22B may change the pull-up driving force of the third inverter 21B based on the delay control voltage VC to change the delay amount of the second delay cell 20B. The second feedback current source 23B may be coupled between the third inverter 21B and the node, from which the high voltage VH is provided. The second feedback current source 23B may receive the output signal OUT3 output from the subsequent delay cell. The second feedback current source 23B may further change the pull-up driving force of the third inverter 21B based on the output signal OUT3 output from the subsequent delay cell. In an embodiment, the second feedback current source 23B may further receive the first switching signal SW1. The second feedback current source 23B may be selectively coupled to the third inverter 21B according to the first switching signal SW1. The second delay cell 20B may further include a fourth inverter 24B. The fourth inverter 24B may inversion-drive the second output signal OUT2 to output the second delayed clock signal DCLK2.

In an embodiment, the second delay cell 20B may further include a second auxiliary current source 25B. The second auxiliary current source 25B may be coupled between the third inverter 21B and the node, from which the high voltage VH is provided. The second auxiliary current source 25B may receive the delay control voltage VC. The second auxiliary current source 25B may further change the pull-up driving force of the third inverter 21B based on the delay control voltage VC. In an embodiment, the second auxiliary current source 25B may further receive the second switching signal SW2. The second auxiliary current source 25B may be selectively coupled to the third inverter 21B according to the second switching signal SW2.

The first inverter 11B may include a first transistor T31 and a second transistor T32. The first transistor T31 may be a P-channel MOS transistor. The second transistor T32 may be a N-channel MOS transistor. The first current source 12B may include a third transistor T33. The third transistor T33 may be a P-channel MOS transistor. The first feedback current source 13B may include a fourth transistor T34 and a fifth transistor T35. Each of the fourth transistor T34 and the fifth transistor T35 may be a P-channel MOS transistor. The first auxiliary current source 15B may include a sixth transistor T36 and a seventh transistor T37. Each of the sixth transistor T36 and the seventh transistor T37 may be a P-channel MOS transistor. The first transistor T31 may receive the input signal IN at its gate, may be coupled to the node, from which the high voltage VH is provided, at its source and may be coupled to a first output node ON1 at its drain. The first output signal OUT1 may be output through the first output node ON1. The second transistor T32 may receive the input signal IN at its gate and may be coupled to the first output node ON1 at its drain. The third transistor T33 may receive the delay control voltage VC at its gate, may be coupled to the node, from which the high voltage VH is provided, at its source and may be coupled at its drain to the source of the first transistor T31. The third transistor T33 may change an amount of current flowing from the node, from which the high voltage VH is provided, to the source of the first transistor T31 based on the delay control voltage VC. The fourth transistor T34 may receive the second output signal OUT2 at its gate and may be coupled to the node, from which the high voltage VH is provided, at its source. The fifth transistor T35 may receive the first switching signal SW1 at its gate, may be coupled at its source to the drain of the fourth transistor T34 and may be coupled at its drain to the source of the first transistor T31. The fourth transistor T34 may further change the amount of current flowing from the node, from which the high voltage VH is provided, to the source of the first transistor T31 based on the second output signal OUT2. The fifth transistor T35 may selectively couple the fourth transistor T34 to the source of the first transistor T31 based on the first switching signal SW1. The sixth transistor T36 may receive the delay control voltage VC at its gate and may be coupled to the node, from which the high voltage VH is provided, at its source. The seventh transistor T37 may receive the second switching signal SW2 at its gate, may be coupled at its source to the drain of the sixth transistor T36 and may be coupled at its drain to the source of the first transistor T31. The sixth transistor T36 may further change the amount of current flowing from the node, from which the high voltage VH is provided, to the source of the first transistor T31 based on the delay control voltage VC. The seventh transistor T37 may selectively couple the sixth transistor T36 to the source of the first transistor T31 based on the second switching signal SW2.

The third inverter 21B may include a first transistor T41 and a second transistor T42. The first transistor T41 may be a P-channel MOS transistor. The second transistor T42 may be a N-channel MOS transistor. The second current source 22B may include a third transistor T43. The third transistor T43 may be a P-channel MOS transistor. The second feedback current source 23B may include a fourth transistor T44 and a fifth transistor T45. Each of the fourth transistor T44 and the fifth transistor T45 may be a P-channel MOS transistor. The second auxiliary current source 25B may include a sixth transistor T46 and a seventh transistor T47. Each of the sixth transistor T46 and the seventh transistor T47 may be a P-channel MOS transistor. The first transistor T41 may receive the first output signal OUT1 at its gate, may be coupled to the node, from which the high voltage VH is provided, at its source and may be coupled to a second output node ON2 at its drain. The second output signal OUT2 may be output through the second output node ON2. The second transistor T42 may receive the first output signal OUT1 at its gate and may be coupled to the second output node ON2 at its drain. The third transistor T43 may receive the delay control voltage VC at its gate, may be coupled to the node, from which the high voltage VH is provided, at its source and may be coupled at its drain to the source of the first transistor T41. The third transistor T43 may change an amount of current flowing from the node, from which the high voltage VH is provided, to the source of the first transistor T41 based on the delay control voltage VC. The fourth transistor T44 may receive at its gate the output signal OUT3 output from the subsequent delay cell and may be coupled to the node, from which the high voltage VH is provided, at its source. The fifth transistor T45 may receive the first switching signal SW1 at its gate, may be coupled at its source to the drain of the fourth transistor T44 and may be coupled at its drain to the source of the first transistor T41. The fourth transistor T44 may further change the amount of current flowing from the node, from which the high voltage VH is provided, to the source of the first transistor T41 based on the second output signal OUT2. The fifth transistor T45 may selectively couple the fourth transistor T44 to the source of the first transistor T41 based on the first switching signal SW1. The sixth transistor T46 may receive the delay control voltage VC at its gate and may be coupled to the node, from which the high voltage VH is provided, at its source. The seventh transistor T47 may receive the second switching signal SW2 at its gate, may be coupled at its source to the drain of the sixth transistor T46 and may be coupled at its drain to the source of the first transistor T41. The sixth transistor T46 may further change the amount of current flowing from the node, from which the high voltage VH is provided, to the source of the first transistor T41 based on the delay control voltage VC. The seventh transistor T47 may selectively couple the sixth transistor T46 to the source of the first transistor T41 based on the second switching signal SW2.

Referring to FIG. 10C, the delay line 1000C may include a first delay cell 10C and a second delay cell 20C. The first delay cell 10C may invert an input signal IN to generate a first output signal OUT1. The first delay cell 10C may inversion-drive the first output signal OUT1 to output a first delayed clock signal DCLK1. The second delay cell 20C may invert the first output signal OUT1 to generate a second output signal OUT2. The second delay cell 20C may inversion-drive the second output signal OUT2 to output a second delayed clock signal DCLK2. Pull-up driving force, with which the first delay cell 10C pulls up the first output signal OUT1 according to the input signal IN, may change based on a pull-up delay control voltage VCP and the second output signal OUT2. Pull-down driving force, with which the first delay cell 10C pulls down the first output signal OUT1 according to the input signal IN, may change based on a pull-down delay control voltage VCN and the second output signal OUT2. Pull-up driving force, with which the second delay cell 20C pulls up the second output signal OUT2 according to the first output signal OUT1, may change based on the pull-up delay control voltage VCP and an output signal OUT3 output from a subsequent delay cell, which is disposed subsequently to the second delay cell 20C and configured to receive the second output signal OUT2. Pull-down driving force, with which the second delay cell 20C pulls down the second output signal OUT2 according to the first output signal OUT1, may change based on the pull-down delay control voltage VCN and an output signal OUT3 output from the subsequent delay cell. The first delay cell 10C may include a first inverter 11C, a first current source 12C, a second current source 13C, a first feedback current source 14C and a second feedback current source 15C. The first delay cell 10C may further include a second inverter 16C, a first auxiliary current source 17C and a second auxiliary current source 18C. The second delay cell 20C may include a third inverter 22C, a third current source 22C, a fourth current source 23C, a third feedback current source 24C and a fourth feedback current source 25C. The second delay cell 20C may further include a fourth inverter 26C, a third auxiliary current source 27C and a fourth auxiliary current source 28C. The delay line 1000C may be configured by consolidating the configurations of the delay lines 1000A and 1000B respectively illustrated in FIGS. 10A and 10B.

The first inverter 11C may receive the input signal IN and may invert the input signal IN to generate the first output signal OUT1. The first current source 12C may be coupled between the first inverter 11C and the node, from which the high voltage VH is provided. The first current source 12C may receive the pull-up delay control voltage VCP. The first current source 12C may change the pull-up driving force of the first inverter 11C based on the pull-up delay control voltage VCP to change the delay amount of the first delay cell 10C. The second current source 13C may be coupled between the first inverter 11C and the node, from which the low voltage VL is provided. The second current source 13C may receive the pull-down delay control voltage VCN. The second current source 13C may change the pull-down driving force of the first inverter 11C based on the pull-down delay control voltage VCN to change the delay amount of the first delay cell 10C. The first feedback current source 14C may be coupled between the first inverter 11C and the node, from which the high voltage VH is provided. The first feedback current source 14C may receive the second output signal OUT2. The first feedback current source 14C may further change the pull-up driving force of the first inverter 11C based on the second output signal OUT2. In an embodiment, the first feedback current source 14C may further receive a complementary signal SW1B of a first switching signal SW1. The first feedback current source 14C may be selectively coupled to the first inverter 11C according to the complementary signal SW1B. The second feedback current source 15C may receive the second output signal OUT2. The second feedback current source 15C may be coupled between the first inverter 11C and the node, from which the low voltage VL is provided. The second feedback current source 15C may further change the pull-down driving force of the first inverter 11C based on the second output signal OUT2. In an embodiment, the second feedback current source 15C may further receive the first switching signal SW1. The second feedback current source 15C may be selectively coupled to the first inverter 11C according to the first switching signal SW1. The second inverter 16C may inversion-drive the first output signal OUT1 to output the first delayed clock signal DCLK1. The first auxiliary current source 17C may be coupled between the first inverter 11C and the node, from which the high voltage VH is provided. The first auxiliary current source 17C may receive the pull-up delay control voltage VCP. The first auxiliary current source 17C may further change the pull-up driving force of the first inverter 11C based on the pull-up delay control voltage VCP. In an embodiment, the first auxiliary current source 17C may further receive a complementary signal SW2B of a second switching signal SW2. The first auxiliary current source 17C may be selectively coupled to the first inverter 11C according to the complementary signal SW2B. The second auxiliary current source 18C may be coupled between the first inverter 11C and the node, from which the low voltage VL is provided. The second auxiliary current source 18C may receive the pull-down delay control voltage VCN. The second auxiliary current source 18C may further change the pull-down driving force of the first inverter 11C based on the pull-down delay control voltage VCN. In an embodiment, the second auxiliary current source 18C may further receive the second switching signal SW2. The second auxiliary current source 18C may be selectively coupled to the first inverter 11C according to the second switching signal SW2.

The third inverter 21C may receive the first output signal OUT1 and may invert the first output signal OUT1 to generate the second output signal OUT2. The third current source 22C may be coupled between the second inverter 21C and the node, from which the high voltage VH is provided. The third current source 22C may receive the pull-up delay control voltage VCP. The third current source 22C may change the pull-up driving force of the second inverter 21C based on the pull-up delay control voltage VCP to change the delay amount of the second delay cell 20C. The fourth current source 23C may be coupled between the third inverter 21C and the node, from which the low voltage VL is provided. The fourth current source 23C may receive the pull-down delay control voltage VCN. The fourth current source 23C may change the pull-down driving force of the third inverter 21C based on the pull-down delay control voltage VCN to change the delay amount of the second delay cell 20C. The third feedback current source 24C may be coupled between the third inverter 21C and the node, from which the high voltage VH is provided. The third feedback current source 24C may receive the output signal OUT3 output from the subsequent delay cell. The third feedback current source 24C may further change the pull-up driving force of the third inverter 21C based on the output signal OUT3 output from the subsequent delay cell. In an embodiment, the third feedback current source 24C may further receive the complementary signal SW1B of the first switching signal SW1. The third feedback current source 24C may be selectively coupled to the third inverter 21C according to the complementary signal SW1B. The fourth feedback current source 25C may receive the output signal OUT3 output from the subsequent delay cell. The fourth feedback current source 25C may be coupled between the third inverter 21C and the node, from which the low voltage VL is provided. The fourth feedback current source 25C may further change the pull-down driving force of the third inverter 21C based on the output signal OUT3 output from the subsequent delay cell. In an embodiment, the fourth feedback current source 25C may further receive the first switching signal SW1. The fourth feedback current source 25C may be selectively coupled to the third inverter 21C according to the first switching signal SW1. The fourth inverter 26C may inversion-drive the second output signal OUT2 to output the second delayed clock signal DCLK2. The third auxiliary current source 27C may be coupled between the third inverter 21C and the node, from which the high voltage VH is provided. The third auxiliary current source 27C may receive the pull-up delay control voltage VCP. The third auxiliary current source 27C may further change the pull-up driving force of the third inverter 21C based on the pull-up delay control voltage VCP. In an embodiment, the third auxiliary current source 27C may further receive the complementary signal SW2B of the second switching signal SW2. The third auxiliary current source 27C may be selectively coupled to the third inverter 21C according to the complementary signal SW2B. The fourth auxiliary current source 28C may be coupled between the third inverter 21C and the node, from which the low voltage VL is provided. The fourth auxiliary current source 28C may receive the pull-down delay control voltage VCN. The fourth auxiliary current source 28C may further change the pull-down driving force of the third inverter 21C based on the pull-down delay control voltage VCN. In an embodiment, the fourth auxiliary current source 28C may further receive the second switching signal SW2. The fourth auxiliary current source 28C may be selectively coupled to the third inverter 21C according to the second switching signal SW2.

Figure 11:
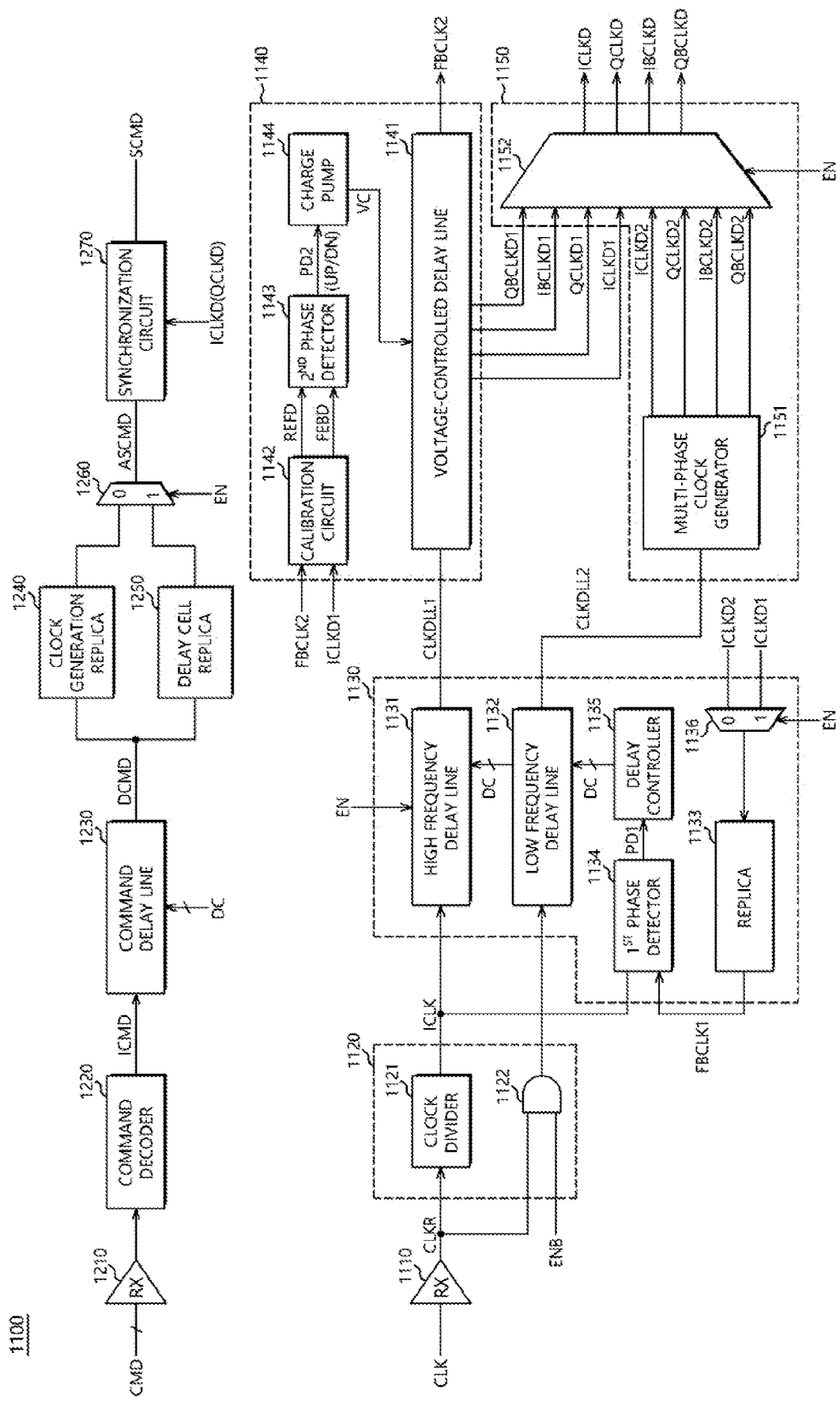
FIG. 11 is a diagram illustrating a configuration of a semiconductor apparatus in accordance with an embodiment.

FIG. 11 is a diagram illustrating a configuration of a semiconductor apparatus 1100 in accordance with an embodiment. Referring to FIG. 11, the semiconductor apparatus 1100 may receive a clock signal CLK and may perform a delay-locking operation on the clock signal CLK to generate a plurality of internal clock signals. The semiconductor apparatus 1100 may include a delay locked loop circuit in order to generate the plurality of internal clock signals from the clock signal CLK. The semiconductor apparatus 1100 may include a clock receiver 1110, a division circuit 1120, a first delay locked loop 1130, a second delay locked loop 1140 and a clock generation circuit 1150. The clock receiver 1110 may receive the clock signal CLK provided from an external of the semiconductor apparatus 1100. The clock receiver 1110 may buffer the clock signal CLK to output a buffered clock signal CLKR. The division circuit 1120 may receive the buffered clock signal CLKR and a frequency information signal EN. The frequency information signal EN may have information about whether the semiconductor apparatus 1100 operates with a relatively high frequency or with a relatively low frequency. For example, when the semiconductor apparatus 1100 operates with a high frequency, the frequency information signal EN may be enabled. For example, when the semiconductor apparatus 1100 operates with a low frequency lower than the high frequency, the frequency information signal EN may be disabled. The division circuit 1120 may receive the buffered clock signal CLKR and may divide the buffered clock signal CLKR to generate a divided clock signal ICLK. The division circuit 1120 may provide the divided clock signal ICLK as a reference clock signal. The division circuit 1120 may selectively output the buffered clock signal CLKR based on the frequency information signal EN. For example, the division circuit 1120 may output, when the frequency information signal EN is disabled, the first delay locked loop 1130 with the divided clock signal ICLK together with the buffered clock signal CLKR.

The first delay locked loop 1130 may be a digital delay locked loop including at least one digitally controlled delay line. The first delay locked loop 1130 may receive the reference clock signal, the frequency information signal EN, a first output clock signal ICLKD1 and a second output clock signal ICLKD2. The first delay locked loop 1130 may perform a delay-locking operation based on the reference clock signal and one signal selected on the basis of the frequency information signal EN between the first output clock signal ICLKD1 and the second output clock signal ICLKD2. The first delay locked loop 1130 may receive, as the reference clock signal, the divided clock signal ICLK generated from the division circuit 1120. The first delay locked loop 1130 may delay the reference clock signal to generate a first delay locked clock signal CLKDLL1. The first delay locked loop 1130 may delay the buffered clock signal CLKR to generate a second delay locked clock signal CLKDLL2. When the frequency information signal EN is enabled, the first delay locked loop 1130 may perform a delay-locking operation based on the first output clock signal ICLKD1 and the divided clock signal ICLK and may delay the divided clock signal ICLK to generate the first delay locked clock signal CLKDLL1. When the frequency information signal EN is disabled, the first delay locked loop 1130 may perform a delay-locking operation based on the second output clock signal ICLKD2 and the divided clock signal ICLK and may delay the buffered clock signal CLKR to generate the second delay locked clock signal CLKDLL2.

The second delay locked loop 1140 may be an analog delay locked loop including a voltage-controlled delay line. The second delay locked loop 1140 may receive the first delay locked clock signal CLKDLL1 to generate the first output clock signal ICLKD1. The second delay locked loop 1140 may perform a delay-locking operation on the first delay locked clock signal CLKDLL1 based on the first delay locked clock signal CLKDLL1 and the first output clock signal ICLKD1 to generate the first output clock signal ICLKD1. The second delay locked loop 1140 may delay the first delay locked clock signal CLKDLL1 to generate a first set of plural output clock signals ICLKD1, QCLKD1, IBCLKD1 and QBCLKD1. One among the first set of plural output clock signals ICLKD1, QCLKD1, IBCLKD1 and QBCLKD1 may be provided as the first output clock signal ICLKD1.

The clock generation circuit 1150 may receive the second delay locked clock signal CLKDLL2. The clock generation circuit 1150 may generate the second output clock signal ICLKD2 based on the second delay locked clock signal CLKDLL2. The clock generation circuit 1150 may generate, from the second delay locked clock signal CLKDLL2, a second set of plural output clock signals ICLKD2, QCLKD2, IBCLKD2 and QBCLKD2. One among the second set of plural output clock signals ICLKD2, QCLKD2, IBCLKD2 and QBCLKD2 may be provided as the second output clock signal ICLKD2. The clock generation circuit 1150 may further receive the frequency information signal EN. Based on the frequency information signal EN, the clock generation circuit 1150 may output, as a plurality of internal clock signals ICLKD, QCLKD, IBCLKD and QBCLKD, one between the first set of plural output clock signals ICLKD1, QCLKD1, IBCLKD1 and QBCLKD1 and the second set of plural output clock signals ICLKD2, QCLKD2, IBCLKD2 and QBCLKD2. When the frequency information signal EN is enabled, the clock generation circuit 1150 may output the first set of plural output clock signals ICLKD1, QCLKD1, IBCLKD1 and QBCLKD1 as the plurality of internal clock signals ICLKD, QCLKD, IBCLKD and QBCLKD. When the frequency information signal EN is disabled, the clock generation circuit 1150 may output the second set of plural output clock signals ICLKD2, QCLKD2, IBCLKD2 and QBCLKD2 as the plurality of internal clock signals ICLKD, QCLKD, IBCLKD and QBCLKD.

When the semiconductor apparatus 1100 operates with a high frequency, the frequency information signal EN may be enabled and a delay-locking operation may be performed through the first delay locked loop 1130 and the second delay locked loop 1140. The division circuit 1120 may divide the buffered clock signal CLKR to output the divided clock signal ICLK as the reference clock signal. The first delay locked loop 1130 may perform a delay-locking operation based on the divided clock signal ICLK and the first output clock signal ICLKD1 to generate the first delay locked clock signal CLKDLL1. When the delay-locking operation of the first delay locked loop 1130 is completed, the second delay locked loop 1140 may perform a delay-locking operation on the first delay locked clock signal CLKDLL1 provided from the first delay locked loop 1130. The second delay locked loop 1140 may perform a delay-locking operation on the first delay locked clock signal CLKDLL1 to generate the first set of plural output clock signals ICLKD1, QCLKD1, IBCLKD1 and QBCLKD1. The clock generation circuit 1150 may output, as the plurality of internal clock signals ICLKD, QCLKD, IBCLKD and QBCLKD, the first set of plural output clock signals ICLKD1, QCLKD1, IBCLKD1 and QBCLKD1, which are output from the second delay locked loop 1140.

When the semiconductor apparatus 1100 operates with a low frequency, the frequency information signal EN may be disabled and a delay-locking operation may be performed through the first delay locked loop 1130. The division circuit 1120 may output the divided clock signal ICLK as the reference clock signal and may output the buffered clock signal CLKR together with the divided clock signal ICLK. The first delay locked loop 1130 may perform a delay-locking operation based on the divided clock signal ICLK and the second output clock signal ICLKD2 and may delay the buffered clock signal CLKR to generate the second delay locked clock signal CLKDLL2. When the delay-locking operation of the first delay locked loop 1130 is completed, the clock generation circuit 1150 may receive the second delay locked clock signal CLKDLL2 from the first delay locked loop 1130. The clock generation circuit 1150 may generate the second set of plural output clock signals ICLKD2, QCLKD2, IBCLKD2 and QBCLKD2 based on the second delay locked clock signal CLKDLL2. The clock generation circuit 1150 may output the second set of plural output clock signals ICLKD2, QCLKD2, IBCLKD2 and QBCLKD2 as the plurality of internal clock signals ICLKD, QCLKD, IBCLKD and QBCLKD.

The division circuit 1120 may include a clock divider 1121 and a gating circuit 1122. The clock divider 1121 may receive the buffered clock signal CLKR and may divide the buffered clock signal CLKR. For example, the clock divider 1121 may divide the buffered clock signal CLKR by two to generate four divided clock signals. The clock divider 1121 may output, as the reference clock signal, one among the four divided clock signals. For example, the clock divider 1121 may output, as the reference clock signal, one divided clock signal ICLK, which has a phase corresponding to a phase of the buffered clock signal CLKR among the four divided clock signals. The gating circuit 1122 may selectively output the buffered clock signal CLKR based on the frequency information signal EN. The gating circuit 1122 may receive the buffered clock signal CLKR and a complementary signal ENB of the frequency information signal EN. The gating circuit 1122 may gate the buffered clock signal CLKR by the complementary signal ENB of the frequency information signal EN. The gating circuit 1122 may include an AND gate. When the frequency information signal EN is disabled or the complementary signal ENB of the frequency information signal EN is enabled, the gating circuit 1122 may output the buffered clock signal CLKR to the first delay locked loop 1130.

The first delay locked loop 1130 may include a high-frequency delay line 1131, a low-frequency delay line 1132, a replica 1133, a first phase detector 1134 and a delay controller 1135. Each of the high-frequency delay line 1131 and the low-frequency delay line 1132 may be a digitally controlled delay line. The high-frequency delay line 1131 may receive the divided clock signal ICLK, a delay control signal DC and the frequency information signal EN. When the frequency information signal EN is enabled, the high-frequency delay line 1131 may delay the divided clock signal ICLK based on the delay control signal DC to generate the first delay locked clock signal CLKDLL1. When the frequency information signal EN is disabled, the high-frequency delay line 1131 may be deactivated. The low-frequency delay line 1132 may receive the buffered clock signal CLKR and the delay control signal DC. The low-frequency delay line 1132 may delay the buffered clock signal CLKR based on the delay control signal DC to generate the second delay locked clock signal CLKDLL2.

The replica 1133 may receive one between the first output clock signal ICLKD1 and the second output clock signal ICLKD2. When the frequency information signal EN is enabled, the replica 1133 may receive the first output clock signal ICLKD1 and may delay the first output clock signal ICLKD1 by an amount of modelled delay time to generate a first feedback clock signal FBCLK1. When the frequency information signal EN is disabled, the replica 1133 may receive the second output clock signal ICLKD2 and may delay the second output clock signal ICLKD2 by an amount of the modelled delay time to generate the first feedback clock signal FBCLK1. In an embodiment, the replica 1133 may be modified to receive one among the plurality of internal clock signals ICLKD, QCLKD, IBCLKD and QBCLKD, which are output from the clock generation circuit 1150, regardless of the frequency information signal EN. For example, the replica 1133 may be modified to receive the internal clock signal ICLKD, which has a phase corresponding to the first output clock signal ICLKD1 and the second output clock signal ICLKD2 among the plurality of internal clock signals ICLKD, QCLKD, IBCLKD and QBCLKD.

The first phase detector 1134 may compare the phases between the divided clock signal ICLK, which is provided as the reference clock signal, and the first feedback clock signal FBCLK1 to generate the first phase detection signal PD1. The delay controller 1135 may generate the delay control signal DC based on the first phase detection signal PD1. The delay controller 1135 may increase or decrease the value of the delay control signal DC according to the logic level of the first phase detection signal PD1. The delay control signal DC may be provided commonly to the high-frequency delay line 1131 and the low-frequency delay line 1132. The delay amounts of the high-frequency delay line 1131 and the low-frequency delay line 1132 may be set on the basis of the delay control signal DC.

The first delay locked loop 1130 may further include a clock selector 1136. The clock selector 1136 may receive the first output clock signal ICLKD1, the second output clock signal ICLKD2 and the frequency information signal EN. The clock selector 1136 may receive, based on the frequency information signal EN, one between the first output clock signal ICLKD1 and the second output clock signal ICLKD2. The clock selector 1136 may be coupled to the replica 1133. The clock signal output from the clock selector 1136 may be input to the replica 1133. When the frequency information signal EN is enabled, the clock selector 1136 may output the first output clock signal ICLKD1 to the replica 1133. When the frequency information signal EN is disabled, the clock selector 1136 may output the second output clock signal ICLKD2 to the replica 1133.

The second delay locked loop 1140 may include a voltage-controlled delay line 1141, a calibration circuit 1142, a second phase detector 1143 and a charge pump 1144. The voltage-controlled delay line 1141 may receive the first delay locked clock signal CLKDLL1 and a delay control voltage VC. The voltage-controlled delay line 1141 may delay the first delay locked clock signal CLKDLL1 based on the delay control voltage VC to generate the first output clock signal ICLKD1 and a second feedback clock signal FBCLK2. The voltage-controlled delay line 1141 may delay the first delay locked clock signal CLKDLL1 to generate the first set of plural output clock signals QCLKD1, IBCLKD1 and QBCLKD1 other than the first output clock signal ICLKD1. The calibration circuit 1142 may receive the first output clock signal ICLKD1 and the second feedback clock signal FBCLK2. The calibration circuit 1142 may detect the phases of the first output clock signal ICLKD1 and the second feedback clock signal FBCLK2. The calibration circuit 1142 may delay the first output clock signal ICLKD1 to generate a delayed reference clock signal REFD. The calibration circuit 1142 may delay the second feedback clock signal FBCLK2 to generate a delayed feedback clock signal FEBD. The calibration circuit 1142 may compensate for a phase error between the first output clock signal ICLKD1 and the second feedback clock signal FBCLK2, which may occur due to the configurations of the second delay locked loop 1140. Accordingly, the second delay locked loop 1140 to perform a precise delay-locking operation. The calibration circuit 420 illustrated in FIG. 4 may be applied as the calibration circuit 1142. The second phase detector 1143 may receive the delayed reference clock signal REFD and the delayed feedback clock signal FEBD. The second phase detector 1143 may detect the phases of the delayed reference clock signal REFD and the delayed feedback clock signal FEBD to generate a second phase detection signal PD2. The second phase detection signal PD2 may include an up signal UP and a down signal DN. The charge pump 1144 may receive the second phase detection signal PD2. The charge pump 1144 may generate the delay control voltage VC based on the second phase detection signal PD2. The charge pump 1144 may raise the voltage level of the delay control voltage VC based on the up signal UP and may lower the voltage level of the delay control voltage VC based on the down signal DN.

The clock generation circuit 1150 may include a multi-phase clock generator 1151 and a clock selector 1152. The multi-phase clock generator 1151 may receive the second delay locked clock signal CLKDLL2. The multi-phase clock generator 1151 may generate the second set of plural output clock signals ICLKD2, QCLKD2, IBCLKD2 and QBCLKD2 from the second delay locked clock signal CLKDLL2. The multi-phase clock generator 1151 may divide the phase of the second delay locked clock signal CLKDLL2 and divide the frequency of the second delay locked clock signal CLKDLL2 to generate the second set of plural output clock signals ICLKD2, QCLKD2, IBCLKD2 and QBCLKD2 having predetermined phase difference therebetween. Although not illustrated, the multi-phase clock generator 1151 may include configurations such as a phase splitter, a divider and so forth. The clock selector 1152 may receive the frequency information signal EN, the first set of plural output clock signals ICLKD1, QCLKD1, IBCLKD1 and QBCLKD1 and the second set of plural output clock signals ICLKD2, QCLKD2, IBCLKD2 and QBCLKD2. Based on the frequency information signal EN, the clock selector 1152 may output, as the plurality of internal clock signals ICLKD, QCLKD, IBCLKD and QBCLKD, one between the first set of plural output clock signals ICLKD1, QCLKD1, IBCLKD1 and QBCLKD1 and the second set of plural output clock signals ICLKD2, QCLKD2, IBCLKD2 and QBCLKD2. When the frequency information signal EN is enabled, the clock selector 1152 may output the first set of plural output clock signals ICLKD1, QCLKD1, IBCLKD1 and QBCLKD1 as the plurality of internal clock signals ICLKD, QCLKD, IBCLKD and QBCLKD. When the frequency information signal EN is disabled, the clock selector 1152 may output the second set of plural output clock signals ICLKD2, QCLKD2, IBCLKD2 and QBCLKD2 as the plurality of internal clock signals ICLKD, QCLKD, IBCLKD and QBCLKD.

The semiconductor apparatus 1100 may include a command receiver 1210, a command decoder 1220, a command delay line 1230, a clock generation replica 1240, a delay cell replica 1250, a command selector 1260 and a synchronization circuit 1270. The command receiver 1210 may receive a command signal CMD provided from an external of the semiconductor apparatus 1100. The command signal CMD may be a control signal for controlling the semiconductor apparatus 1100 to perform various operations. The command signal CMD may include a plurality of signals of different kinds. The command decoder 1220 may decode the command signal CMD, which is provided through the command receiver 1210, to generate an internal command signal ICMD. The command decoder 1220 may generate the internal command signal ICMD of various kinds based on the command signal CMD. For example, the internal command signal ICMD may include but may not be limited to an active command signal, a precharge command signal, a read command signal, a write command signal, an on-die termination command signal, a refresh command signal and so forth. The command decoder 1220 may latch the command signal CMD, which is provided through the command receiver 1210, based on the buffered clock signal CLKR. The command decoder 1220 may decode the latched command signal to generate the internal command signal ICMD.

The command delay line 1230 may receive the internal command signal ICMD and the delay control signal DC. The command delay line 1230 may delay the internal command signal ICMD based on the delay control signal DC to generate a delayed command signal DCMD. The delay amount of the command delay line 1230 may be set on the basis of the delay control signal DC. The command delay line 1230 may have substantially the same configuration as the high-frequency delay line 1131 and/or the low-frequency delay line 1132. Since the command delay line 1230, the frequency delay line 1131 and the low-frequency delay line 1132 commonly receive the delay control signal DC, the delay amount of the command delay line 1230 may set to be substantially the same as the delay amount of the high-frequency delay line 1131 and/or the delay amount of the low-frequency delay line 1132. The internal command signal ICMD may be delayed through the command delay line 1230 by an time as much as the divided clock signal ICLK or the buffered clock signal CLKR is delayed through the high-frequency delay line 1131 or the low-frequency delay line 1132.

The clock generation replica 1240 may delay the delayed command signal DCMD to generate an additionally delayed command signal. The clock generation replica 1240 may be a circuit, to which the clock generation circuit 1150 is modelled. The clock generation replica 1240 may further delay the delayed command signal DCMD by a time that is taken for the clock generation circuit 1150 to generate the second set of plural output clock signals ICLKD2, QCLKD2, IBCLKD2 and QBCLKD2. The clock generation circuit 1150 may generate the second set of plural output clock signals ICLKD2, QCLKD2, IBCLKD2 and QBCLKD2 from the second delay locked clock signal CLKDLL2 that is delayed through the low-frequency delay line 1132. Therefore, the clock generation replica 1240 may delay the delayed command signal DCMD by an time that is taken for the second set of plural output clock signals ICLKD2, QCLKD2, IBCLKD2 and QBCLKD2 to be generated from the second delay locked clock signal CLKDLL2 thereby matching timing of the command signal output from the clock generation replica 1240 to the phases of the second set of plural output clock signals ICLKD2, QCLKD2, IBCLKD2 and QBCLKD2.

The delay cell replica 1250 may be a circuit, to which at least one among a plurality of delay cells configuring the voltage-controlled delay line 1141 is modelled. A number of delay cells included in the delay cell replica 1250 may correspond to a number of delay cells utilized to generate the first output clock signal ICLKD1 from the first delay locked clock signal CLKDLL1. For example, when the first delay locked clock signal CLKDLL1 is delayed through one delay cell to be generated as the first output clock signal ICLKD1 within the voltage-controlled delay line 1141, the delay cell replica 1250 may be configured to include one delay cell. The delay cell replica 1250 may receive the delayed command signal DCMD and the delay control signal DC and may delay the delayed command signal DCMD based on the delay control voltage VC to generate the additionally delayed command signal. The first delay locked clock signal CLKDLL1 delayed through the high-frequency delay line 1131 may be further delayed through the voltage-controlled delay line 1141 of the second delay locked loop 1140. The delay cell replica 1250 may delay the delayed command signal DCMD by an time that is taken for the first set of plural output clock signals ICLKD1, QCLKD1, IBCLKD1 and QBCLKD1 to be generated from the first delay locked clock signal CLKDLL1 thereby matching timing of the command signal output from the delay cell replica 1250 to the phases of the first set of plural output clock signals ICLKD1, QCLKD1, IBCLKD1 and QBCLKD1.

The command selector 1260 may receive the output signal from the clock generation replica 1240, the output signal from the delay cell replica 1250 and the frequency information signal EN. Based on the frequency information signal EN, the command selector 1260 may output, as an asynchronized command signal ASCMD, one between the output signal from the clock generation replica 1240 and the output signal from the delay cell replica 1250. When the frequency information signal EN is enabled, the command selector 1260 may output the output signal from the delay cell replica 1250 as the asynchronized command signal ASCMD. When the frequency information signal EN is disabled, the command selector 1260 may output the output signal from the clock generation replica 1240 as the asynchronized command signal ASCMD.

The synchronization circuit 1270 may receive the asynchronized command signal ASCMD and one among the plurality of internal clock signals ICLKD, QCLKD, IBCLKD and QBCLKD. For example, the synchronization circuit 1270 may receive the internal clock signal ICLKD. The synchronization circuit 1270 may change the domain of the asynchronized command signal ASCMD. The synchronization circuit 1270 may synchronize the asynchronized command signal ASCMD to the internal clock signal ICLKD to output a synchronized command signal SCMD. The synchronization circuit 1270 may transform the asynchronized command signal ASCMD into the synchronized command signal SCMD, which is synchronized with the internal clock signal ICLKD. Internal circuits of the semiconductor apparatus 1100 may utilize the synchronized command signal SCMD. In an embodiment, the synchronization circuit 1270 may be modified to generate the synchronized command signal SCMD, which is synchronized with the internal clock signal QCLKD.

While certain embodiments have been described above, it will be understood to those skilled in the art that the embodiments described are by way of example only. Accordingly, the delay line, delay locked loop circuit and semiconductor apparatus using the same should not be limited based on the described embodiments. Rather, the delay line, delay locked loop circuit and semiconductor apparatus using the same described herein should only be limited in light of the claims that follow when taken in conjunction with the above description and accompanying drawings.

What is claimed is:

1. A delay locked loop circuit comprising:
   a voltage-controlled delay line configured to delay a reference clock signal based on a delay control voltage to generate an internal clock signal and a feedback clock signal;
   a calibration circuit configured to delay the internal clock signal and the feedback clock signal to generate a delayed reference clock signal and a delayed feedback clock signal, and to change delay amount of the internal clock signal and delay amount of the feedback clock signal according to phases of the internal clock signal and the feedback clock signal;
   a phase detector configured to compare phases between the delayed reference clock signal and the delayed feedback clock signal to generate a phase detection signal; and
   a charge pump configured to generate the delay control voltage based on the phase detection signal.

2. The delay locked loop circuit of claim 1, wherein the voltage-controlled delay line delays the reference clock signal based on the delay control voltage to generate a plurality of delayed clock signals, output one among the plurality of delayed clock signals as the internal clock signal and outputs another one among the plurality of delayed clock signals as the feedback clock signal.

3. The delay locked loop circuit of claim 1, wherein the voltage-controlled delay line includes at least a first delay cell and a second delay cell, wherein the first delay cell is configured to invert an input signal to generate a first output signal and the second delay cell is configured to invert the first output signal to generate a second output signal, and wherein driving force, with which the first delay cell pulls down the first output signal, is adjusted on the basis of the delay control voltage and the second output signal.

4. The delay locked loop circuit of claim 1, wherein the voltage-controlled delay line includes at least a first delay cell and a second delay cell, wherein the first delay cell is configured to invert an input signal to generate a first output signal and the second delay cell is configured to invert the first output signal to generate a second output signal, and wherein driving force, with which the first delay cell pulls up the first output signal, is adjusted on the basis of the delay control voltage and the second output signal.

5. The delay locked loop circuit of claim 1, wherein the voltage-controlled delay line includes at least a first delay cell and a second delay cell and the delay control voltage includes a pull-up control voltage and a pull-down control voltage, wherein the first delay cell is configured to invert an input signal to generate a first output signal and the second delay cell is configured to invert the first output signal to generate a second output signal, and wherein driving force, with which the first delay cell pulls up the first output signal, is adjusted on the basis of the pull-up control voltage and the second output signal and driving force, with which the first delay cell pulls down the first output signal, is adjusted on the basis of the pull-down control voltage and the second output signal.

6. The delay locked loop circuit of claim 1, wherein, when the feedback clock signal has a lagging phase to the internal clock signal, the calibration circuit delays the internal clock signal by a first time to generate the delayed reference clock signal and delays the feedback clock signal by a second time to generate the delayed feedback clock signal, the second time being longer than the first time, and wherein, when the feedback clock signal has a leading phase to the internal clock signal, the calibration circuit delays the internal clock signal by the second time to generate the delayed reference clock signal and delays the feedback clock signal by the first time to generate the delayed feedback clock signal.

7. The delay locked loop circuit of claim 1, wherein the calibration circuit includes:
a timing skew detector configured to detect phases of the internal clock signal and the feedback clock signal to generate a first phase adjustment signal and a second phase adjustment signal;
a calibration signal generator configured to generate a calibration signal based on the first phase adjustment signal and the second phase adjustment signal; and
a delay adjuster configured to delay the internal clock signal based on a part of the calibration signal to generate the delayed reference clock signal and delay the feedback clock signal based on a remaining part of the calibration signal to generate the delayed feedback clock signal.

8. The delay locked loop circuit of claim 7,
wherein the timing skew detector detects the phases of the internal clock signal and the feedback clock signal to generate a first skew detection signal and a second skew detection signal, and generates the first phase adjustment signal and the second phase adjustment signal according to whether logic levels of the first skew detection signal and the second skew detection signal are kept at a same logic level for a time corresponding to at least double of a unit cycle.

9. The delay locked loop circuit of claim 7, wherein the timing skew detector includes:
a skew detector configured to detect the phases of the internal clock signal and the feedback clock signal to generate a first skew detection signal and a second skew detection signal;
a filter configured to generate, in synchronization with a first clock signal, a first even signal from the first skew detection signal and a second even signal from the second skew detection signal, to generate, in synchronization with a second clock signal having a lagging phase to the first clock signal, a first odd signal from the first skew detection signal and a second odd signal from the second skew detection signal and to generate, based on the first even signal, the second even signal, the first odd signal and the second odd signal, a first phase information signal and a second phase information signal; and
a phase adjustment signal generator configured to generate the first phase adjustment signal based on the first phase information signal and to generate the second phase adjustment signal based on the second phase information signal.

10. The delay locked loop circuit of claim 7, wherein the delay adjuster includes:
a first variable delayer, of which a delay amount is set on the basis of the part of the calibration signal, configured to delay the internal clock signal to generate the delayed reference clock signal; and
a second variable delayer, of which a delay amount is set on the basis of the remaining part of the calibration signal, configured to delay the feedback clock signal to generate the delayed feedback clock signal.

11. A delay locked loop circuit comprising:
a voltage-controlled delay line configured to delay a reference clock signal based on a delay control voltage to generate an internal clock signal and a feedback clock signal;
a calibration circuit configured to generate a calibration signal based on the internal clock signal and the feedback clock signal, and to delay the internal clock signal and the feedback clock signal based on the calibration signal to generate a delayed reference clock signal and a delayed feedback clock signal;
a phase detector configured to compare phases between the delayed reference clock signal and the delayed feedback clock signal to generate a phase detection signal; and
a charge pump configured to generate the delay control voltage based on the phase detection signal.

12. The delay locked loop circuit of claim 11, wherein the calibration circuit includes:
a timing skew detector configured to detect phases of the internal clock signal and the feedback clock signal to generate a first phase adjustment signal and a second phase adjustment signal;
a calibration signal generator configured to generate the calibration signal based on the first phase adjustment signal and the second phase adjustment signal; and
a delay adjuster configured to delay the internal clock signal and the feedback clock signal based on the calibration signal to generate the delayed reference clock signal and the delayed feedback clock signal.

13. The delay locked loop circuit of claim 12,
wherein the delay adjuster is configured to delay the internal clock signal based on a part of the calibration signal to generate the delayed reference clock signal and delay the feedback clock signal based on a remaining part of the calibration signal to generate the delayed feedback clock signal.

* * * * *